(12) United States Patent
Newmeyer et al.

(10) Patent No.: US 12,163,079 B2
(45) Date of Patent: *Dec. 10, 2024

(54) SYNTHESIS OF BLUE-EMITTING ZNSE$_{1-X}$TE$_X$ ALLOY NANOCRYSTALS WITH LOW FULL WIDTH AT HALF-MAXIMUM

(71) Applicant: Shoei Chemical Inc., Tokyo (JP)

(72) Inventors: Benjamin Newmeyer, San Jose, CA (US); Christian Ippen, Cupertino, CA (US); Ruiqing Ma, Morristown, NJ (US)

(73) Assignee: SHOEI CHEMICAL INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/973,958

(22) Filed: Oct. 26, 2022

(65) Prior Publication Data

US 2023/0235224 A1 Jul. 27, 2023

Related U.S. Application Data

(63) Continuation of application No. 16/991,096, filed on Aug. 12, 2020, now Pat. No. 11,499,097.

(Continued)

(51) Int. Cl.
*C09K 11/88* (2006.01)
*B82Y 20/00* (2011.01)
(Continued)

(52) U.S. Cl.
CPC .......... *C09K 11/883* (2013.01); *H01L 33/005* (2013.01); *H01L 33/06* (2013.01);
(Continued)

(58) Field of Classification Search
CPC ... C09K 11/883; C09K 11/025; C09K 11/565; C09K 11/02; H01L 33/005; H01L 33/06;
(Continued)

(56) References Cited

U.S. PATENT DOCUMENTS 8,637,082 B2   1/2014 Tulsky et al.
2005/0214536 A1* 9/2005 Schrier .................. C09K 11/02
427/215

(Continued)

FOREIGN PATENT DOCUMENTS

EP       3401380 A1    11/2008
WO   WO 2010040032 A1  4/2010
(Continued)

OTHER PUBLICATIONS

Asano et al., "Synthesis of Colloidal Zn (Te,Se) Alloy Quantum Dots," *Materials Research Express*, vol. 4, No. 10, published Oct. 3, 2017; 11 pages.

(Continued)

*Primary Examiner* — Jonathan Han
(74) *Attorney, Agent, or Firm* — Alleman Hall & Tuttle LLP

(57) ABSTRACT

The invention pertains to the field of nanotechnology. The invention provides highly luminescent nanostructures, particularly highly luminescent nanostructures comprising a ZnSe$_{1-x}$Te$_x$ core and ZnS and/or ZnSe shell layers. The nanostructures comprising a ZnSe$_{1-x}$Te$_x$ core and ZnS and/or ZnSe shell layers display a low full width at half-maximum and a high quantum yield. The invention also provides methods of producing the nanostructures.

17 Claims, 2 Drawing Sheets

Related U.S. Application Data

(60) Provisional application No. 62/885,469, filed on Aug. 12, 2019.

(51) Int. Cl.
  *H01L 33/00* (2010.01)
  *H01L 33/06* (2010.01)
  *H01L 33/50* (2010.01)

(52) U.S. Cl.
  CPC ............ *H01L 33/502* (2013.01); *B82Y 20/00* (2013.01); *H01L 2933/0041* (2013.01)

(58) Field of Classification Search
  CPC .......... H01L 33/502; H01L 2933/0041; B82Y 20/00; B82Y 30/00; B82Y 40/00; C01B 19/007; H10K 50/115
  See application file for complete search history.

(56) References Cited

U.S. PATENT DOCUMENTS

| | | | |
|---|---|---|---|
| 2007/0273275 A1 | 11/2007 | Jang et al. | |
| 2010/0044635 A1* | 2/2010 | Breen | B82Y 30/00 252/301.6 R |
| 2015/0083969 A1* | 3/2015 | Kim | C09K 11/705 977/774 |
| 2017/0037314 A1 | 2/2017 | Ki et al. | |
| 2017/0352779 A1* | 12/2017 | Kuzumoto | H01L 33/06 |
| 2019/0257003 A1* | 8/2019 | Kim | H01L 33/28 |
| 2019/0280231 A1* | 9/2019 | Kim | C09K 11/883 |
| 2019/0280233 A1* | 9/2019 | Kim | H10K 85/115 |
| 2019/0390109 A1 | 12/2019 | Ippen et al. | |

FOREIGN PATENT DOCUMENTS

| | | |
|---|---|---|
| WO | WO 2012035535 A1 | 3/2012 |
| WO | WO 2019231828 A1 | 12/2019 |

OTHER PUBLICATIONS

Chin-Hau, C. et al, "Radiative Recombination of Indirect Exciton in Type-II ZnSeTe/ZnSe Multiple Quantum Wells," Journal of Luminescence, Elsevier BV, vol. 131, No. 5, published Dec. 31, 2010' pp. 956-959.

Fairclough, S et al., "Growth and Characterization of Strained and Alloyed Type-II ZnTe/ZnSe Core-Shell Nanocrystals," Journal of Physical Chemistry C, vol. 116, published Nov. 18, 2012; pp. 26898-26907.

International Search Report and Written Opinion of the International Searching Authority directed to related International Patent Application No. PCT/US2020/045925, mailed Nov. 2, 2020; 15 pages.

Li et al., "Synthesis of Cd-Free Water-Soluble $ZnSe_{1-x}Te_x$ Nanocrystals with High Luminescence in the Blue Region," Journal of Colloid and Interface Science, vol. 321, Issue 2, published May 15, 2008; pp. 468-476.

Zhang, J. et al., "Shape-Control of ZnTe Nanocrystal Growth in Organic Solution," Journal of Physical Chemistry C, vol. 112, published Mar. 18, 2008; pp. 5454-5458.

\* cited by examiner

SYNTHESIS OF BLUE-EMITTING ZNSE$_{1-x}$TE$_X$ ALLOY NANOCRYSTALS WITH LOW FULL WIDTH AT HALF-MAXIMUM

RELATED APPLICATION

This application is a continuation of U.S. patent application Ser. No. 16/991,096, filed Aug. 12, 2022, now allowed, which claims priority to U.S. Provisional Application No. 62/885,469, filed Aug. 12, 2019, all of which are incorporated by reference in their entirety.

BACKGROUND OF THE INVENTION

Field of the Invention

The invention pertains to the field of nanotechnology. The invention provides highly luminescent nanostructures, particularly highly luminescent nanostructures comprising a ZnSe$_{1-x}$Te$_x$ core and ZnS and/or ZnSe shell layers. The nanostructures comprising a ZnSe$_{1-x}$Te$_x$ core and ZnS and/or ZnSe shell layers display a low full width at half-maximum and a high quantum yield. The invention also provides methods of producing the nanostructures.

Background Art

Semiconductor nanostructures can be incorporated into a variety of electronic and optical devices. The electrical and optical properties of such nanostructures vary, e.g., depending on their composition, shape, and size. For example, size-tunable properties of semiconductor nanoparticles are of great interest for applications such as light emitting diodes (LEDs), lasers, and biomedical labeling. Highly luminescent nanostructures are particularly desirable for such applications.

To exploit the full potential of nanostructures in applications such as LEDs and displays, the nanostructures need to simultaneously meet five criteria: narrow and symmetric emission spectra, high photoluminescence (PL) quantum yields (QYs), high optical stability, eco-friendly materials, and low-cost methods for mass production. Most previous studies on highly emissive and color-tunable quantum dots have concentrated on materials containing cadmium, mercury, or lead. Wang, A., et al., *Nanoscale* 7:2951-2959 (2015). But, there are increasing concerns that toxic materials such as cadmium, mercury, or lead would pose serious threats to human health and the environment and the European Union's Restriction of Hazardous Substances rules ban any consumer electronics containing more than trace amounts of these materials. Therefore, there is a need to produce materials that are free of cadmium, mercury, and lead for the production of LEDs and displays.

Electroluminescent quantum dot light-emitting devices with BT.2020 color gamut require a blue-emitting quantum dot material with a peak wavelength in the range of 450 nm to 460 nm with less than a 30 nm full width at half-maximum (FWHM) and high quantum yield. For regulatory compliance, the material needs to be free of cadmium and lead.

It is difficult to achieve these parameters with cadmium-free materials. As described in Ning, J., et al., *Chem. Commun.* 53:2626-2629 (2017), indium phosphide quantum dots grown from magic size clusters as the smallest imaginable core show a minimum photoluminescence peak of 460 nm (with >50 nm FWHM and low quantum yield) and red shift upon shell coating. As described in U.S. Patent Appl. No. 2017/0066965, ZnSe quantum dots can be made with very sharp emission peaks and high quantum yields at a peak wavelength of up to 435 nm, but further particle growth towards the target wavelength resulted in significant quantum yield loss due to poor electron-hole overlap in giant cores.

A need exists to prepare nanostructure compositions that have a peak emission wavelength in the range of 440 nm to 460 nm and a FWHM of less than 30 nm.

BRIEF SUMMARY OF THE INVENTION

The present disclosure provides a nanostructure comprising a core surrounded by at least one shell, wherein the core comprises ZnSe$_{1-x}$Te$_x$, wherein $0<x<1$, wherein the at least one shell is selected from the group consisting of ZnS, ZnSe, ZnTe, and alloys thereof, and wherein the full width at half maximum (FWHM) of the nanostructure is about 20 nm to about 30 nm.

In some embodiments, the FWHM is about 25 nm to about 30 nm.

In some embodiments, the emission wavelength of the nanostructure is between about 440 nm and about 460 nm. In some embodiments, the emission wavelength of the nanostructure is 450-460 nm.

In some embodiments, the core of the nanostructure is surrounded by two shells.

In some embodiments, at least one shell of the nanostructure comprises ZnS or ZnSe.

In some embodiments, at least one shell of the nanostructure comprises ZnSe.

In some embodiments, at least one shell of the nanostructure comprises ZnS.

In some embodiments, at least one shell of the nanostructure comprises between about 4 and about 6 monolayers of ZnSe.

In some embodiments, at least one shell of the nanostructure comprises about 6 monolayers of ZnSe.

In some embodiments, at least one shell of the nanostructure comprises between about 4 and about 6 monolayers of ZnS.

In some embodiments, at least one shell of the nanostructure comprises about 4 monolayers of ZnS.

In some embodiments, the photoluminescence quantum yield of the nanostructure is between about 75% and about 90%.

In some embodiments, the photoluminescence quantum yield of the nanostructure is between 80% and 90%.

In some embodiments, the FWHM of the nanostructure is between about 15 nm and about 19 nm.

In some embodiments, the nanostructure comprises two shells, wherein the first shell comprises ZnSe and the second shell comprises ZnS.

In some embodiments, the nanostructure is a quantum dot.

In some embodiments, the nanostructure is free of cadmium.

In some embodiments, a device comprising the nanostructure of the present disclosure is provided.

The present disclosure also provides a method of producing a ZnSe$_{1-x}$Te$_x$ nanocrystal comprising:
(a) admixing a tellurium source, at least one ligand, and a reducing agent to produce a reaction mixture;
(b) contacting the reaction mixture obtained in (a) with a solution comprising at least one ligand, zinc fluoride, and a selenium source; and
(c) contacting the reaction mixture obtained in (b) with a zinc source; to provide a ZnSe$_{1-x}$Te$_x$ nanocrystal.

In some embodiments, the selenium source is selected from the group consisting of trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, cyclohexylphosphine selenide, octaselenol, dodecaselenol, selenophenol, elemental selenium, hydrogen selenide, bis(trimethylsilyl) selenide, and mixtures thereof. In some embodiments, the selenium source is trioctylphosphine selenide.

In some embodiments, the at least one ligand in (b) is selected from the group consisting of trioctylphosphine oxide, trioctylphosphine, diphenylphosphine, triphenylphosphine oxide, and tributylphosphine oxide. In some embodiments, the at least one ligand in (b) is diphenylphosphine.

In some embodiments, the tellurium source is selected from the group consisting of trioctylphosphine telluride, tri(n-butyl)phosphine telluride, trimethylphosphine telluride, triphenylphosphine telluride, tricyclohexylphosphine telluride, elemental tellurium, hydrogen telluride, bis(trimethylsilyl) telluride, and mixtures thereof. In some embodiments, the tellurium source is trioctylphosphine telluride.

In some embodiments, the reducing agent is selected from the group consisting of diborane, sodium hydride, sodium borohydride, lithium borohydride, sodium cyanoborohydride, calcium hydride, lithium hydride, lithium aluminum hydride, diisobutylaluminum hydride, sodium triethylborohydride, and lithium triethylborohydride. In some embodiments, the reducing agent is lithium triethylborohydride.

In some embodiments, the zinc source in (c) is selected from the group consisting of diethylzinc, dimethylzinc, diphenylzinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, and zinc sulfate. In some embodiments, the zinc source in (c) is diethylzinc.

In some embodiments, the method further comprises: (d) contacting the reaction mixture in (c) with a zinc carboxylate and a selenium source.

In some embodiments, the zinc carboxylate in (d) is selected from the group consisting of zinc oleate, zinc hexanoate, zinc octanoate, zinc laurate, zinc myristate, zinc palmitate, zinc stearate, zinc dithiocarbamate, and mixtures thereof. In some embodiments, the zinc carboxylate in (d) is zinc oleate.

In some embodiments, the selenium source in (d) is selected from the group consisting of trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, cyclohexylphosphine selenide, octaselenol, dodecaselenol, selenophenol, elemental selenium, hydrogen selenide, bis(trimethylsilyl) selenide, and mixtures thereof. In some embodiments, the selenium source in (d) is trioctylphosphine selenide.

In some embodiments, the admixing in (a) is at about room temperature.

In some embodiments, the contacting in (b) is at a temperature between about 250° C. and about 350° C. In some embodiments, the contacting in (b) is at a temperature of about 280° C.

In some embodiments, the contacting in (c) is at a temperature between about 250° C. and about 350° C. In some embodiments, the contacting in (c) is at a temperature of about 280° C.

In some embodiments, the contacting in (c) further comprises at least one ligand. In some embodiments, the at least one ligand is trioctylphosphine or diphenylphosphine.

In some embodiments, the contacting in (d) is at a temperature between about 250° C. and about 350° C. In some embodiments, the contacting in (d) is at a temperature of about 310° C.

In some embodiments, the contacting in (d) further comprises at least one ligand. In some embodiments, the at least one ligand is trioctylphosphine or diphenylphosphine.

The disclosure further provides method of producing a core/shell nanostructure comprising:
(e) admixing the $ZnSe_{1-x}Te_x$ nanocrystal prepared by any one of the methods above with a solution comprising a zinc source; and
(f) contacting the reaction mixture of (e) with a selenium source or a sulfur source.

In some embodiments, the method further comprises:
(g) contacting the reaction mixture of (f) with a selenium source or a sulfur source; wherein the source used in (g) is different than the source used in (f).

In some embodiments, the admixing in (e) is at a temperature between about 20° C. and about 310° C. In some embodiments, the admixing in (e) is at a temperature between about 20° C. and about 100° C.

In some embodiments, the zinc source of (e) is selected from the group consisting of diethylzinc, dimethylzinc, diphenylzinc, zinc acetate, zinc acetylacetonate, zinc iodide, zinc bromide, zinc chloride, zinc fluoride, zinc carbonate, zinc cyanide, zinc nitrate, zinc oleate, zinc oxide, zinc peroxide, zinc perchlorate, zinc sulfate, zinc hexanoate, zinc octanoate, zinc laurate, zinc myristate, zinc palmitate, zinc stearate, zinc dithiocarbamate, zinc oleate, zinc hexanoate, zinc octanoate, zinc laurate, zinc myristate, zinc palmitate, zinc stearate, zinc dithiocarbamate, and mixtures thereof.

In some embodiments, the contacting in (f) is at a temperature between about 200° C. and about 350° C. In some embodiments, the contacting in (f) is at a temperature of about 310° C.

In some embodiments, in (f) the reaction mixture is contacted with a selenium source. In some embodiments, the selenium source is selected from the group consisting of trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, cyclohexylphosphine selenide, octaselenol, dodecaselenol, selenophenol, elemental selenium, hydrogen selenide, bis(trimethylsilyl) selenide, and mixtures thereof.

In some embodiments, in (f) the reaction mixture is contacted with a sulfur source. In some embodiments, the sulfur source is selected from the group consisting of elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trioctylphosphine sulfide, and mixtures thereof.

In some embodiments, the contacting in (f) is at a temperature between about 200° C. and about 350° C. In some embodiments, the contacting in (f) is at a temperature of about 310° C.

In some embodiments, in (g) the reaction mixture is contacted with a selenium source. In some embodiments, the selenium source is selected from the group consisting of trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, cyclohexylphosphine selenide, octaselenol, dodecaselenol, selenophenol, elemental selenium, hydrogen selenide, bis(trimethylsilyl) selenide, and mixtures thereof.

In some embodiments, in (g) the reaction mixture is contacted with a sulfur source. In some embodiments, the sulfur source is selected from the group consisting of elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trioctylphosphine sulfide, and mixtures thereof.

In some embodiments, the admixing in (e) further comprises at least one ligand. In some embodiments, the at least one ligand is selected from the group consisting of trioctylphosphine oxide, trioctylphosphine, diphenylphosphine, triphenylphosphine oxide, and tributylphosphine oxide. In some embodiments, the at least one ligand is trioctylphosphine or trioctylphosphine oxide.

In some embodiments, the nanostructure displays a photoluminescence quantum yield of between about 75% and about 90%. In some embodiments, the nanostructure displays a photoluminescence quantum yield of between about 80% and about 90%.

In some embodiments, the nanostructure has a full width at half-maximum of about 20 nm to about 30 nm. In some embodiments, the nanostructure has a full width at half-maximum of between about 25 nm and about 30 nm.

The present disclosure also provides a method of producing a $ZnSe_{1-x}Te_x$ nanocrystal comprising:
  (a) admixing a selenium source and at least one ligand to produce a reaction mixture;
  (b) contacting the reaction mixture obtained in (a) with a solution comprising a tellurium source, a reducing agent, and a zinc carboxylate; and
  (c) contacting the reaction mixture obtained in (b) with a zinc source;
to provide a $ZnSe_{1-x}Te_x$ nanocrystal.

In some embodiments, the selenium source admixed in (a) is selected from the group consisting of trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, cyclohexylphosphine selenide, octaselenol, dodecaselenol, selenophenol, elemental selenium, hydrogen selenide, bis(trimethylsilyl) selenide, and mixtures thereof.

In some embodiments, the selenium source admixed in (a) is trioctylphosphine selenide.

In some embodiments, the at least one ligand admixed in (a) is selected from the group consisting of trioctylphosphine oxide, trioctylphosphine, diphenylphosphine, triphenylphosphine oxide, and tributylphosphine oxide.

In some embodiments, the at least one ligand admixed in (a) is trioctylphosphine.

In some embodiments, the tellurium source in (b) is selected from the group consisting of trioctylphosphine telluride, tri(n-butyl)phosphine telluride, trimethylphosphine telluride, triphenylphosphine telluride, tricyclohexylphosphine telluride, elemental tellurium, hydrogen telluride, bis(trimethylsilyl) telluride, and mixtures thereof.

In some embodiments, the tellurium source in (b) is trioctylphosphine telluride.

In some embodiments, the reducing agent in (b) is selected from the group consisting of diborane, sodium hydride, sodium borohydride, lithium borohydride, sodium cyanoborohydride, calcium hydride, lithium hydride, lithium aluminum hydride, diisobutylaluminum hydride, sodium triethylborohydride, and lithium triethylborohydride.

In some embodiments, the reducing agent in (b) is lithium triethylborohydride.

In some embodiments, the zinc carboxylate in (b) is selected from the group consisting of zinc oleate, zinc hexanoate, zinc octanoate, zinc laurate, zinc myristate, zinc palmitate, zinc stearate, zinc dithiocarbamate, and mixtures thereof.

In some embodiments, the zinc carboxylate in (b) is zinc oleate.

In some embodiments, the zinc source in (c) is selected from the group consisting of diethylzinc, dimethylzinc, diphenylzinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, and zinc sulfate.

In some embodiments, the zinc source in (c) is diethylzinc.

In some embodiments, the method of producing a $ZnSe_{1-x}Te_x$ nanocrystal comprising, further comprises:
  (d) contacting the reaction mixture in (c) with a zinc source and a selenium source.

In some embodiments, the zinc source in (d) is selected from the group consisting of diethylzinc, dimethylzinc, diphenylzinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, and zinc sulfate.

In some embodiments, the zinc source in (d) is diethylzinc.

In some embodiments, the selenium source in (d) is selected from the group consisting of trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, cyclohexylphosphine selenide, octaselenol, dodecaselenol, selenophenol, elemental selenium, hydrogen selenide, bis(trimethylsilyl) selenide, and mixtures thereof.

In some embodiments, the selenium source in (d) is trioctylphosphine selenide.

In some embodiments, the admixing in (a) is at a temperature between about 250° C. and about 350° C.

In some embodiments, the admixing in (a) is at a temperature of about 300° C.

In some embodiments, the contacting in (b) is at a temperature between about 250° C. and about 350° C.

In some embodiments, the contacting in (b) is at a temperature of about 300° C.

In some embodiments, the contacting in (b) further comprises at least one ligand.

In some embodiments, the contacting in (c) is at a temperature between about 250° C. and about 350° C.

In some embodiments, the contacting in (c) is at a temperature of about 300° C.

In some embodiments, the contacting in (c) further comprises at least one ligand. In some embodiments, the at least one ligand is trioctylphosphine or diphenylphosphine.

In some embodiments, the contacting in (d) is at a temperature between about 250° C. and about 350° C.

In some embodiments, the contacting in (d) is at a temperature of about 300° C.

In some embodiments, the contacting in (d) further comprises at least one ligand. In some embodiments, the at least one ligand is trioctylphosphine or diphenylphosphine.

In some embodiments, the selenium source in (a) is trioctylphosphine selenide, the tellurium source in (b) is trioctylphosphine telluride, the reducing agent in (b) is lithium triethylborohydride, the zinc carboxylate in (b) is zinc oleate, and the zinc source in (c) in diethylzinc.

In some embodiments, the selenium source in (a) and (c) is trioctylphosphine selenide, the tellurium source in (b) is trioctylphosphine telluride, the reducing agent in (b) is lithium triethylborohydride, the zinc carboxylate in (b) is zinc oleate, and the zinc source in (c) and (d) is diethylzinc.

The present disclosure provides a method of producing a core/shell nanostructure comprising:
 (e) admixing the $ZnSe_{1-x}Te_x$ nanocrystal prepared by a method disclosed herein with a solution comprising a zinc source;
 (f) contacting the reaction mixture of (e) with a selenium source or a sulfur source.

In some embodiments, the method of producing a core/shell nanostructure further comprises:
 (g) contacting the reaction mixture of (f) with a selenium source or a sulfur source; wherein the source used in (g) is different than the source used in (f).

In some embodiments, the admixing in (e) is at a temperature between about 20° C. and about 310° C.

In some embodiments, the admixing in (e) is at a temperature between about 20° C. and about 100° C.

In some embodiments, the zinc source of (e) is selected from the group consisting of diethylzinc, dimethylzinc, diphenylzinc, zinc acetate, zinc acetylacetonate, zinc iodide, zinc bromide, zinc chloride, zinc fluoride, zinc carbonate, zinc cyanide, zinc nitrate, zinc oleate, zinc oxide, zinc peroxide, zinc perchlorate, zinc sulfate, zinc hexanoate, zinc octanoate, zinc laurate, zinc myristate, zinc palmitate, zinc stearate, zinc dithiocarbamate, zinc oleate, zinc hexanoate, zinc octanoate, zinc laurate, zinc myristate, zinc palmitate, zinc stearate, zinc dithiocarbamate, and mixtures thereof.

In some embodiments, the contacting in (f) is at a temperature between about 200° C. and about 350° C.

In some embodiments, the contacting in (f) is at a temperature of about 310° C.

In some embodiments, the reaction mixture in (f) is contacted with a selenium source.

In some embodiments, the selenium source is selected from the group consisting of trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, cyclohexylphosphine selenide, octaselenol, dodecaselenol, selenophenol, elemental selenium, hydrogen selenide, bis(trimethylsilyl) selenide, and mixtures thereof.

In some embodiments, the reaction mixture in (f) is contacted with a sulfur source.

In some embodiments, the sulfur source is selected from the group consisting of elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trioctylphosphine sulfide, and mixtures thereof.

In some embodiments, the contacting in (f) is at a temperature between about 200° C. and about 350° C.

In some embodiments, the contacting in (f) is at a temperature of about 310° C.

In some embodiments, the reaction mixture in (g) is contacted with a selenium source.

In some embodiments, the selenium source is selected from the group consisting of trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, cyclohexylphosphine selenide, octaselenol, dodecaselenol, selenophenol, elemental selenium, hydrogen selenide, bis(trimethylsilyl) selenide, and mixtures thereof.

In some embodiments, the reaction mixture in (g) is contacted with a sulfur source.

In some embodiments, the sulfur source is selected from the group consisting of elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trioctylphosphine sulfide, and mixtures thereof.

In some embodiments, the admixing in (e) further comprises at least one ligand.

In some embodiments, the at least one ligand is selected from the group consisting of trioctylphosphine oxide, trioctylphosphine, diphenylphosphine, triphenylphosphine oxide, and tributylphosphine oxide.

In some embodiments, the at least one ligand is trioctylphosphine or trioctylphosphine oxide.

In some embodiments, the nanostructure provided by the method displays a photoluminescence quantum yield of between about 75% and about 90%.

In some embodiments, the nanostructure provided by the method displays a photoluminescence quantum yield of between about 80% and about 90%.

In some embodiments, the nanostructure provided by the method has a full width at half-maximum of about 20 nm to about 30 nm.

In some embodiments, the nanostructure provided by the method has a full width at half-maximum of between about 15 nm and about 19 nm.

The present disclosure also provides a nanostructure molded article comprising:
 (a) a first conductive layer;
 (b) a second conductive layer; and
 (c) a nanostructure layer between the first conductive layer and the second conductive layer, wherein the nanostructure layer comprises a population of nanostructures comprising a core surrounded by at least one shell, wherein the core comprises $ZnSe_{1-x}Te_x$, wherein $0<x<1$, wherein the at least one shell is selected from the group consisting of ZnS, ZnSe, ZnTe, and alloys thereof, and wherein the full width at half maximum (FWHM) of the nanostructure is about 20 nm to about 30 nm.

In some embodiments, the nanostructure in the nanostructure molded article comprises two shells.

In some embodiments, at least one shell of the nanostructure in the nanostructure molded article is selected from the group consisting of wherein at least one shell comprises ZnS or ZnSe.

In some embodiments, at least one shell of the nanostructure in the nanostructure molded article comprises ZnSe.

In some embodiments, at least one shell of the nanostructure in the nanostructure molded article comprises ZnS.

In some embodiments, at least two shells of the nanostructure in the nanostructure molded article comprise zinc.

In some embodiments, at least one shell of the nanostructure in the nanostructure molded article comprises ZnSe and at least one shell comprises ZnS.

In some embodiments, the nanostructure in the nanostructure molded article exhibits a photoluminescence quantum yield of between about 75% and about 90%.

In some embodiments, the nanostructure in the nanostructure molded article exhibits a photoluminescence quantum yield of between about 80% and about 90%.

In some embodiments, the nanostructure in the nanostructure molded article exhibits a full width at half-maximum of about 20 nm to about 30 nm.

In some embodiments, the nanostructure molded article exhibits a full width at half-maximum of between about 15 nm and about 19 nm.

In some embodiments, the nanostructures in the nanostructure molded article comprise at least one shell comprising ZnSe, and at least one shell comprising ZnS.

In some embodiments, the nanostructures in the nanostructure molded article are quantum dots.

DETAILED DESCRIPTION OF THE INVENTION

Definitions

Figure 1:
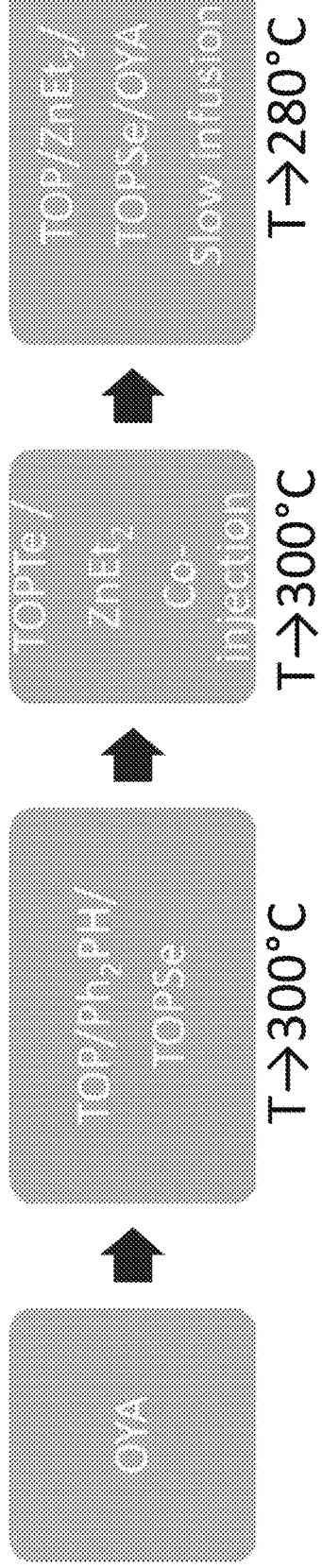
FIG. 1 is a flowchart comparing the synthesis of a $ZnSe_{1-x}Te_x$ core using the co-injection method and synthesis of a $ZnSe_{1-x}Te_x$ core using the offset injection method.
Figure 1:
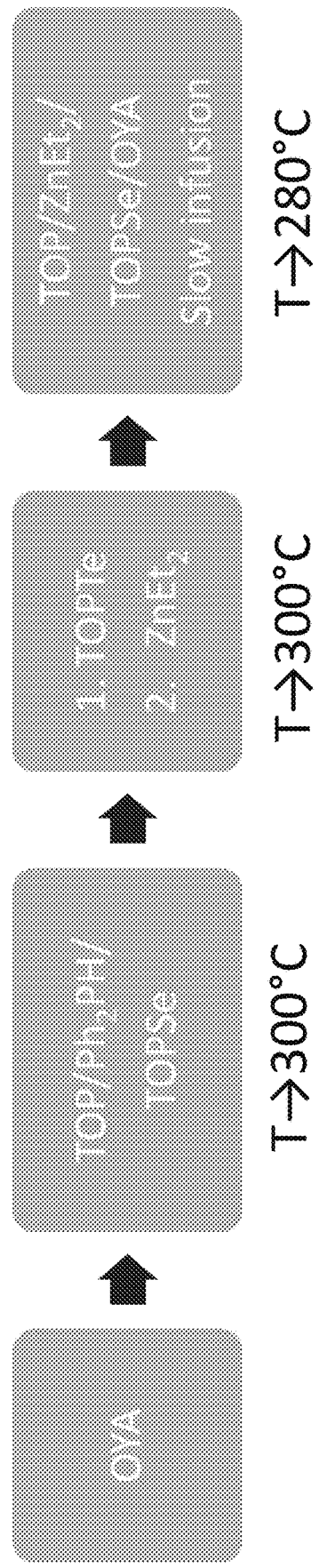

Unless defined otherwise, all technical and scientific terms used herein have the same meaning as commonly understood by one of ordinary skill in the art to which the invention pertains. The following definitions supplement those in the art and are directed to the current application and are not to be imputed to any related or unrelated case, e.g., to any commonly owned patent or application. Although any methods and materials similar or equivalent to those described herein can be used in the practice for testing of the present invention, the preferred materials and methods are described herein. Accordingly, the terminology used herein is for the purpose of describing particular embodiments only, and is not intended to be limiting.

As used in this specification and the appended claims, the singular forms "a," "an," and "the" include plural referents unless the context clearly dictates otherwise. Thus, for example, reference to "a nanostructure" includes a plurality of such nanostructures, and the like.

The term "about" as used herein indicates the value of a given quantity varies by +/−10% of the value so described. For example, "about 100 nm" encompasses a range of sizes from 90 nm to 110 nm, inclusive.

A "nanostructure" is a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, tripods, bipods, nanocrystals, nanodots, quantum dots, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can but need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure comprising a core and one or more shells, "monocrystalline" indicates that the core is substantially crystalline and comprises substantially a single crystal.

A "nanocrystal" is a nanostructure that is substantially monocrystalline. A nanocrystal thus has at least one region or characteristic dimension with a dimension of less than about 500 nm. In some embodiments, the nanocrystal has a dimension of less than about 200 nm, less than about 100 nm, less than about 50 nm, less than about 20 nm, or less than about 10 nm. The term "nanocrystal" is intended to encompass substantially monocrystalline nanostructures comprising various defects, stacking faults, atomic substitutions, and the like, as well as substantially monocrystalline nanostructures without such defects, faults, or substitutions. In the case of nanocrystal heterostructures comprising a core and one or more shells, the core of the nanocrystal is typically substantially monocrystalline, but the shell(s) need not be. In some embodiments, each of the three dimensions of the nanocrystal has a dimension of less than about 500 nm, less than about 200 nm, less than about 100 nm, less than about 50 nm, less than about 20 nm, or less than about 10 nm.

The term "quantum dot" (or "dot") refers to a nanocrystal that exhibits quantum confinement or exciton confinement. Quantum dots can be substantially homogenous in material properties, or in certain embodiments, can be heterogeneous, e.g., including a core and at least one shell. The optical properties of quantum dots can be influenced by their particle size, chemical composition, and/or surface composition, and can be determined by suitable optical testing available in the art. The ability to tailor the nanocrystal size, e.g., in the range between about 1 nm and about 15 nm, enables photoemission coverage in the entire optical spectrum to offer great versatility in color rendering.

A "ligand" is a molecule capable of interacting (whether weakly or strongly) with one or more faces of a nanostructure, e.g., through covalent, ionic, van der Waals, or other molecular interactions with the surface of the nanostructure.

"Photoluminescence quantum yield" is the ratio of photons emitted to photons absorbed, e.g., by a nanostructure or population of nanostructures. As known in the art, quantum yield is typically determined by a comparative method using well-characterized standard samples with known quantum yield values.

"Peak emission wavelength" (PWL) is the wavelength where the radiometric emission spectrum of the light source reaches its maximum.

As used herein, the term "shell" refers to material deposited onto the core or onto previously deposited shells of the same or different composition and that result from a single act of deposition of the shell material. The exact shell thickness depends on the material as well as the precursor input and conversion and can be reported in nanometers or monolayers. As used herein, "target shell thickness" refers to the intended shell thickness used for calculation of the required precursor amount. As used herein, "actual shell thickness" refers to the actually deposited amount of shell material after the synthesis and can be measured by methods known in the art. By way of example, actual shell thickness can be measured by comparing particle diameters determined from transmission electron microscopy (TEM) images of nanocrystals before and after a shell synthesis.

As used herein, the term "monolayer" is a measurement unit of shell thickness derived from the bulk crystal structure of the shell material as the closest distance between relevant lattice planes. By way of example, for cubic lattice structures the thickness of one monolayer is determined as the distance between adjacent lattice planes in the direction. By way of example, one monolayer of cubic ZnSe corresponds to 0.328 nm and one monolayer of cubic ZnS corresponds to 0.31 nm thickness. The thickness of a monolayer of alloyed materials can be determined from the alloy composition through Vegard's law.

As used herein, the term "full width at half-maximum" (FWHM) is a measure of the size distribution of quantum dots. The emission spectra of quantum dots generally have the shape of a Gaussian curve. The width of the Gaussian curve is defined as the FWHM and gives an idea of the size distribution of the particles. A smaller FWHM corresponds to a narrower quantum dot nanocrystal size distribution. FWHM is also dependent upon the emission wavelength maximum.

As used herein, the term "external quantum efficiency" (EQE) is a ratio of the number of photons emitted from a light emitting diode (LED) to the number of electrons passing through the device. The EQE measures how efficiently a LED converts electrons to photons and allows them to escape. EQE can be measured using the formula:

$$EQE=[\text{injection efficiency}]\times[\text{solid-state quantum yield}]\times[\text{extraction efficiency}]$$

where:
  injection efficiency=the proportion of electrons passing through the device that are injected into the active region;
  solid-state quantum yield=the proportion of all electron-hole recombinations in the active region that are radiative and thus, produce photons; and
  extraction efficiency=the proportion of photons generated in the active region that escape from the device.

Unless clearly indicated otherwise, ranges listed herein are inclusive.

A variety of additional terms are defined or otherwise characterized herein.

Production of Nanostructures

Methods for colloidal synthesis of a variety of nanostructures are known in the art. Such methods include techniques for controlling nanostructure growth, e.g., to control the size and/or shape distribution of the resulting nanostructures.

In a typical colloidal synthesis, semiconductor nanostructures are produced by rapidly injecting precursors that undergo pyrolysis into a hot solution (e.g., hot solvent and/or surfactant). The precursors can be injected simultaneously or sequentially. The precursors rapidly react to form nuclei. Nanostructure growth occurs through monomer addition to the nuclei.

Surfactant molecules interact with the surface of the nanostructure. At the growth temperature, the surfactant molecules rapidly adsorb and desorb from the nanostructure surface, permitting the addition and/or removal of atoms from the nanostructure while suppressing aggregation of the growing nanostructures. In general, a surfactant that coordinates weakly to the nanostructure surface permits rapid growth of the nanostructure, while a surfactant that binds more strongly to the nanostructure surface results in slower nanostructure growth. The surfactant can also interact with one (or more) of the precursors to slow nanostructure growth.

Nanostructure growth in the presence of a single surfactant typically results in spherical nanostructures. Using a mixture of two or more surfactants, however, permits growth to be controlled such that non-spherical nanostructures can be produced, if, for example, the two (or more) surfactants adsorb differently to different crystallographic faces of the growing nanostructure.

A number of parameters are thus known to affect nanostructure growth and can be manipulated, independently or in combination, to control the size and/or shape distribution of the resulting nanostructures. These include, e.g., temperature (nucleation and/or growth), precursor composition, time-dependent precursor concentration, ratio of the precursors to each other, surfactant composition, number of surfactants, and ratio of surfactant(s) to each other and/or to the precursors.

Synthesis of Group II-VI nanostructures has been described, e.g., in U.S. Pat. Nos. 6,225,198, 6,322,901, 6,207,229, 6,607,829, 7,060,243, 7,374,824, 6,861,155, 7,125,605, 7,566,476, 8,158,193, and 8,101,234 and U.S. Patent Appl. Publication Nos. 2011/0262752 and 2011/0263062.

Although Group II-VI nanostructures such as CdSe/CdS/ZnS core/shell quantum dots can exhibit desirable luminescence behavior, as noted above, issues such as the toxicity of cadmium limit the applications for which such nanostructures can be used. Less toxic alternatives with favorable luminescence properties are thus highly desirable.

In some embodiments, the nanostructures are free from cadmium. As used herein, the term "free of cadmium" is intended that the nanostructures contain less than 100 ppm by weight of cadmium. The Restriction of Hazardous Substances (RoHS) compliance definition requires that there must be no more than 0.01%(100 ppm) by weight of cadmium in the raw homogeneous precursor materials. The cadmium level in the Cd-free nanostructures of the present invention is limited by the trace metal concentration in the precursor materials. The trace metal (including cadmium) concentration in the precursor materials for the Cd-free nanostructures, is measured by inductively coupled plasma mass spectroscopy (ICP-MS) analysis, and are on the parts per billion (ppb) level. In some embodiments, nanostructures that are "free of cadmium" contain less than about 50 ppm, less than about 20 ppm, less than about 10 ppm, or less than about 1 ppm of cadmium.

Production of the $ZnSe_{1-x}Te_x$ Core

Using density function theory (DFT) calculations, it is predicted that the localization of Te atoms in the center of a ZnSe core would result in a red shift in the observed emission spectra while at the same time would maintain a type I overlap between the electron and hole wave functions in the conduction and valence bands. Type I overlap occurs in nanocrystals in which the exciton-exciton interaction is attractive and hence the interaction energy is negative. Piryatinski, A., et al., *Nano Letters* 7(1): 108-115 (2007). On the other hand, by separating electrons and holes spatially, one can increase the repulsive component of the interaction energy, which can reverse the sign of the interaction energy. In the case of strongly confined type II nanocrystals, this strategy can lead not only to overall exciton-exciton repulsion but also to large magnitudes of interaction energies, which can be produced because of very small separation between interacting charges.

It is believed that variation of the location and number of Te atoms across the quantum dot core would result in peak broadening. Trioctylphosphine telluride is known to decompose to elemental Te, which is only slowly reduced to $Te^{2-}$. See U.S. Pat. No. 8,637,082. This reaction is not matched to that between diethylzinc and trioctylphosphine selenide and results in low and poorly controlled incorporation of Te atoms into ZnSe. Improved ZnTe nanomaterials resulted from the use of strong reducing agents in conjunction with trioctylphosphine telluride to promote the formation of $Te^{2-}$. See Zhang, J., et al., *J. Phys. Chem. C.* 112(14):5454-5458 (2008) which describes the use of zinc carboxylates to prevent the formation of elemental zinc.

A conventional procedure for preparation of ZnSe cores involves reduction of trioctylphosphine telluride with superhydride in an oleylamine solution which forms a purple solution. The purple solution is mixed with one equivalent of zinc carboxylate dissolved in trioctylphosphine which results in the formation of a colorless milky mixture that is still of sufficiently low viscosity for rapid injection. This milky mixture is co-injected with diethylzinc into trioctylphosphine selenide (at a level of 8 mole percentage telluride). After the cores are grown and washed, the cores are coated with a shell as described in U.S. Patent Appl. Publication No. 2017/066965, which is incorporated herein by reference in its entirety.

In some embodiments, the nanostructure comprises a $ZnSe_{1-x}Te_x$ core, wherein $0<x<1, 0<x<0.5, 0<x<0.25, 0<x<0.1, 0<x<0.05, 0<x<0.02, 0<x<0.01, 0.01<x<0.5, 0.01<x<0.25, 0.01<x<0.1, 0.01<x<0.05, 0.01<x<0.02, 0.02<x<0.5, 0.02<x<0.25, 0.02<x<0.1, 0.02<x<0.05, 0.05<x<0.5, 0.05<x<0.25, 0.05<x<0.1, 0.1<x<0.5, 0.1<x<0.25,$ or $0.5<x<0.25$.

The diameter of the $ZnSe_{1-x}Te_x$ core can be controlled by varying the amount of precursors provided. The diameter of the $ZnSe_{1-x}Te_x$ core can be determined using techniques known to those of skill in the art. In some embodiments, the diameter of the $ZnSe_{1-x}Te_x$ core is determined using transmission electron microscopy (TEM).

In some embodiments, each $ZnSe_{1-x}Te_x$ core has a diameter of between about 1.0 nm and about 7.0 nm, about 1.0 nm and about 6.0 nm, about 1.0 nm and about 5.0 nm, about 1.0 nm and about 4.0 nm, about 1.0 nm and about 3.0 nm, about 1.0 nm and about 2.0 nm, about 2.0 nm and about 7.0 nm, about 2.0 nm and about 6.0 nm, about 2.0 nm and about 5.0 nm, about 2.0 nm and about 4.0 nm, about 2.0 nm and about 3.0 nm, about 3.0 nm and about 7.0 nm, about 3.0 nm and about 6.0 nm, about 3.0 nm and about 5.0 nm, about 3.0 nm and about 4.0 nm, about 4.0 nm and about 7.0 nm, about 4.0 nm and about 6.0 nm, about 4.0 nm and about 5.0 nm, about 5.0 nm and about 7.0 nm, about 5.0 nm and about 6.0 nm, or about 6.0 nm and about 7.0 nm. In some embodiments, the $ZnSe_{1-x}Te_x$ core has a diameter of between about 3.0 nm and about 5.0 nm.

The present disclosure also provides a method of producing a $ZnSe_{1-x}Te_x$ nanocrystal comprising:
(a) admixing a tellurium source, at least one ligand, and a reducing agent to produce a reaction mixture;
(b) contacting the reaction mixture obtained in (a) with a solution comprising at least one ligand, zinc fluoride, and a selenium source; and
(c) contacting the reaction mixture obtained in (b) with a zinc source;

to provide a $ZnSe_{1-x}Te_x$ nanocrystal.

In some embodiments, the present invention provides a method of producing a $ZnSe_{1-x}Te_x$ nanocrystal comprising:

(a) admixing a selenium source and at least one ligand to produce a reaction mixture;

(b) contacting the reaction mixture obtained in (a) with a solution comprising a tellurium source, a reducing agent, and a zinc carboxylate; and (c) contacting the reaction mixture obtained in (b) with a zinc source;

to provide a $ZnSe_{1-x}Te_x$ nanocrystal.

In some embodiments, the present invention provides a method of producing a $ZnSe_{1-x}Te_x$ nanocrystal comprising:

(a) admixing a selenium source and at least one ligand to produce a reaction mixture;

(b) contacting the reaction mixture obtained in (a) with a solution comprising a tellurium source, a reducing agent, and a zinc carboxylate; and (c) contacting the reaction mixture obtained in (b) with a zinc source;

(d) contacting the reaction mixture in (c) with a zinc source and a selenium source;

to provide a $ZnSe_{1-x}Te_x$ nanocrystal.

In some embodiments, the selenium source is selected from trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, cyclohexylphosphine selenide, octaselenol, dodecaselenol, selenophenol, elemental selenium, hydrogen selenide, bis(trimethylsilyl) selenide, and mixtures thereof. In some embodiments, the selenium source is trioctylphosphine selenide (TOPSe).

In some embodiments, the $ZnSe_{1-x}Te_x$ core is synthesized in the presence of at least one nanostructure ligand. Ligands can, e.g., enhance the miscibility of nanostructures in solvents or polymers (allowing the nanostructures to be distributed throughout a composition such that the nanostructures do not aggregate together), increase quantum yield of nanostructures, and/or preserve nanostructure luminescence (e.g., when the nanostructures are incorporated into a matrix). In some embodiments, the ligand(s) for the core synthesis and for the shell synthesis are the same. In some embodiments, the ligand(s) for the core synthesis and for the shell synthesis are different. Following synthesis, any ligand on the surface of the nanostructures can be exchanged for a different ligand with other desirable properties. Examples of ligands are disclosed in U.S. Patent Application Publication Nos. 2005/0205849, 2008/0105855, 2008/0118755, 2009/0065764, 2010/0140551, 2013/0345458, 2014/0151600, 2014/0264189, and 2014/0001405.

In some embodiments, ligands suitable for the synthesis of nanostructure cores, including $ZnSe_{1-x}Te_x$ cores, are known by those of skill in the art. In some embodiments, the ligand is a fatty acid selected from lauric acid, caproic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from dodecylamine, oleylamine, hexadecylamine, and octadecylamine. In some embodiments, the ligand is trioctylphosphine (TOP). In some embodiments, the ligand is oleylamine.

In some embodiments, the core is produced in the presence of a mixture of ligands. In some embodiments, the core is produced in the presence of a mixture comprising 2, 3, 4, 5, or 6 different ligands. In some embodiments, the core is produced in the presence of a mixture comprising 3 different ligands. In some embodiments, the mixture of ligands comprises oleylamine, diphenylphosphine, and trioctylphosphine.

In some embodiments, a selenium source and a ligand are admixed in (a) at a reaction temperature between about 250° C. and about 350° C., about 250° C. and about 320° C., about 250° C. and about 300° C., about 250° C. and about 290° C., about 250° C. and about 280° C., about 250° C. and about 270° C., about 270° C. and about 350° C., about 270° C. and about 320° C., about 270° C. and about 300° C., about 270° C. and about 290° C., about 270° C. and about 280° C., about 280° C. and about 350° C., about 280° C. and about 320° C., about 280° C. and about 300° C., about 280° C. and about 290° C., about 290° C. and about 350° C., about 290° C. and about 320° C., about 290° C. and about 300° C., about 300° C. and about 350° C., about 300° C. and about 320° C., or about 320° C. and about 350° C. In some embodiments, a selenium source and a ligand are admixed in (a) at a reaction temperature of about 300° C.

In some embodiments, the reaction mixture after admixing a selenium source and a ligand in (a) is maintained at an elevated temperature for between about 2 and about 20 minutes, about 2 and about 15 minutes, about 2 and about 10 minutes, about 2 and about 8 minutes, about 2 and about 5 minutes, about 5 and about 20 minutes, about 5 and about 15 minutes, about 5 and about 10 minutes, about 5 and about 8 minutes, about 8 and about 20 minutes, about 8 and about 15 minutes, about 8 and about 10 minutes, about 10 and about 20 minutes, about 10 and about 15 minutes, or about 15 and about 20 minutes.

In some embodiments, the solution comprising a tellurium source, a reducing agent, and a zinc carboxylate in (b) is prepared separately. In some embodiments, the solution comprising a tellurium source, a reducing agent, and a zinc carboxylate in (b) is prepared in situ.

In some embodiments, the solution comprising a tellurium source, a reducing agent, and a zinc carboxylate in (b) is prepared separately. In some embodiments, the method for preparing the tellurium solution comprises:

(a) admixing a tellurium source and a ligand to produce a reaction mixture;

(b) contacting the reaction mixture in (a) with a reducing agent; and (c) contacting the reaction mixture in (b) with a zinc carboxylate;

to produce a tellurium solution.

In some embodiments, the tellurium source is selected from trioctylphosphine telluride, tri(n-butyl)phosphine telluride, trimethylphosphine telluride, triphenylphosphine telluride, tricyclohexylphosphine telluride, elemental tellurium, hydrogen telluride, bis(trimethylsilyl) telluride, and mixtures thereof. In some embodiments, the tellurium source is trioctylphosphine telluride (TOPTe).

In some embodiments, the reducing agent is selected from diborane, sodium hydride, sodium borohydride, lithium borohydride, sodium cyanoborohydride, calcium hydride, lithium hydride, lithium aluminum hydride, diisobutylaluminum hydride, sodium triethylborohydride, and lithium triethylborohydride. In some embodiments, the reducing agent is lithium triethylborohydride.

In some embodiments, the zinc carboxylate is produced by reacting a zinc salt and a carboxylic acid.

In some embodiments, the zinc salt is selected from zinc acetate, zinc fluoride, zinc chloride, zinc bromide, zinc iodide, zinc nitrate, zinc triflate, zinc tosylate, zinc mesylate, zinc oxide, zinc sulfate, zinc acetylacetonate, zinc toluene- 3,4-dithiolate, zinc p-toluenesulfonate, zinc diethyldithiocarbamate, zinc dibenzyldithiocarbamate, and mixtures thereof.

In some embodiments, the carboxylic acid is selected from acetic acid, propionic acid, butyric acid, valeric acid, caproic acid, heptanoic acid, caprylic acid, capric acid, undecanoic acid, lauric acid, myristic acid, palmitic acid, stearic acid, behenic acid, acrylic acid, methacrylic acid, but-2-enoic acid, but-3-enoic acid, pent-2-enoic acid, pent-4-enoic acid, hex-2-enoic acid, hex-3-enoic acid, hex-4-enoic acid, hex-5-enoic acid, hept-6-enoic acid, oct-2-enoic acid, dec-2-enoic acid, undec-10-enoic acid, dodec-5-enoic acid, oleic acid, gadoleic acid, erucic acid, linoleic acid, α-linolenic acid, calendic acid, eicosadienoic acid, eicosatrienoic acid, arachidonic acid, stearidonic acid, benzoic acid, para-toluic acid, ortho-toluic acid, meta-toluic acid, hydrocinnamic acid, naphthenic acid, cinnamic acid, para-toluenesulfonic acid, and mixtures thereof.

In some embodiments, the zinc carboxylate is zinc stearate or zinc oleate. In some embodiments, the zinc carboxylate is zinc oleate.

In some embodiments, the solution comprising a tellurium source, a reducing agent, and a zinc carboxylate in (b) are added to the reaction mixture at a reaction temperature between about 250° C. and about 350° C., about 250° C. and about 320° C., about 250° C. and about 300° C., about 250° C. and about 290° C., about 250° C. and about 280° C., about 250° C. and about 270° C., about 270° C. and about 350° C., about 270° C. and about 320° C., about 270° C. and about 300° C., about 270° C. and about 290° C., about 270° C. and about 280° C., about 280° C. and about 350° C., about 280° C. and about 320° C., about 280° C. and about 300° C., about 280° C. and about 290° C., about 290° C. and about 350° C., about 290° C. and about 320° C., about 290° C. and about 300° C., about 300° C. and about 350° C., about 300° C. and about 320° C., or about 320° C. and about 350° C. In some embodiments, the solution comprising a tellurium source, a reducing agent, and a zinc carboxylate in (b) are added to the reaction mixture at a reaction temperature of about 300° C.

In some embodiments, the reaction mixture-after addition of a solution comprising a tellurium source, a reducing agent, and a zinc carboxylate in (b)—is contacted with a zinc source in (c).

In some embodiments, the zinc source in (c) is added to the reaction mixture between about 1 second and about 5 minutes, about 1 second and about 3 minutes, about 1 second and about 1 minute, about 1 second and about 30 seconds, about 1 second and about 10 seconds, about 1 second and about 5 seconds, about 5 seconds and about 5 minutes, about 5 seconds and about 3 minutes, about 5 seconds and about 1 minute, about 5 seconds and about 30 seconds, about 5 seconds and about 10 seconds, about 10 seconds and about 5 minutes, about 10 seconds and about 3 minutes, about 10 seconds and about 1 minute, about 10 seconds and about 30 seconds, about 30 seconds and about 5 minutes, about 30 seconds and about 3 minutes, about 30 seconds and about 1 minute, about 1 minute and about 5 minutes, about 1 minute and about 3 minutes, or about 3 minutes and about 5 minutes after addition of the solution in (b) comprising a tellurium source, a reducing agent, and a zinc carboxylate. In some embodiments, the zinc source in (c) is added to the reaction mixture between about 1 second and 5 seconds after addition of the solution in (b) comprising a tellurium source, a reducing agent, and a zinc carboxylate.

In some embodiments, the zinc source is added to the reaction mixture in (c) at a reaction temperature between about 250° C. and about 350° C., about 250° C. and about 320° C., about 250° C. and about 300° C., about 250° C. and about 290° C., about 250° C. and about 280° C., about 250° C. and about 270° C., about 270° C. and about 350° C., about 270° C. and about 320° C., about 270° C. and about 300° C., about 270° C. and about 290° C., about 270° C. and about 280° C., about 280° C. and about 350° C., about 280° C. and about 320° C., about 280° C. and about 300° C., about 280° C. and about 290° C., about 290° C. and about 350° C., about 290° C. and about 320° C., about 290° C. and about 300° C., about 300° C. and about 350° C., about 300° C. and about 320° C., or about 320° C. and about 350° C. In some embodiments, a zinc source in (c) added to the reaction mixture at a reaction temperature of about 300° C.

In some embodiments, the zinc source in (c) is a dialkyl zinc compound. In some embodiments, the zinc source is diethylzinc, dimethylzinc, diphenylzinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, or zinc sulfate. In some embodiments, the zinc source is diethylzinc or dimethylzinc. In some embodiments, the zinc source is diethylzinc.

In some embodiments, the mole percentage of tellurium source to zinc source is between about 1% and about 20%, about 1% and about 15%, about 1% and about 10%, about 1% and about 8%, about 1% and about 6%, about 1% and about 4%, about 1% and about 2%, about 2% and about 20%, about 2% and about 15%, about 2% and about 10%, about 2% and about 8%, about 2% and about 6%, about 2% and about 4%, about 4% and about 20%, about 4% and about 15%, about 4% and about 10%, about 4% and about 8%, about 4% and about 6%, about 6% and about 20%, about 6% and about 15%, about 6% and about 10%, about 6% and about 8%, about 8% and about 20%, about 8% and about 15%, about 8% and about 10%, about 10% and about 20%, about 10% and about 15%, or about 15% and about 20%. In some embodiments, the mole percentage of tellurium source to zinc source is between about 6% and about 10%. In some embodiments, the mole percentage of tellurium source to zinc source is about 8%.

In some embodiments, the reaction mixture—after addition of a zinc source in (c)—is contacted with a zinc source and a selenium source. In some embodiments, the zinc source and the selenium source are added in (d) to the reaction mixture at a reaction temperature between about 250° C. and about 350° C., about 250° C. and about 320° C., about 250° C. and about 300° C., about 250° C. and about 290° C., about 250° C. and about 280° C., about 250° C. and about 270° C., about 270° C. and about 350° C., about 270° C. and about 320° C., about 270° C. and about 300° C., about 270° C. and about 290° C., about 270° C. and about 280° C., about 280° C. and about 350° C., about 280° C. and about 320° C., about 280° C. and about 300° C., about 280° C. and about 290° C., about 290° C. and about 350° C., about 290° C. and about 320° C., about 290° C. and about 300° C., about 300° C. and about 350° C., about 300° C. and about 320° C., or about 320° C. and about 350° C. In some embodiments, a zinc source and a selenium source in (d) are added to the reaction mixture at a reaction temperature of about 280° C.

In some embodiments, the zinc source and the selenium source are added in (d) over a period of between about 2 and about 120 minutes, about 2 and about 60 minutes, about 2 and about 30 minutes, about 2 and about 20 minutes, about 2 and about 15 minutes, about 2 and about 10 minutes, about 2 and about 8 minutes, about 2 and about 5 minutes, about 5 and about 120 minutes, about 5 and about 60 minutes, about 5 and about 30 minutes, about 5 and about 20 minutes, about 5 and about 15 minutes, about 5 and about 10 minutes, about 5 and about 8 minutes, about 8 and about 120 minutes, about 8 and about 60 minutes, about 8 and about 30 minutes, about 8 and about 20 minutes, about 8 and about 15 minutes, about 8 and about 10 minutes, about 10 and about 120 minutes, about 10 and about 60 minutes, about 10 and about 30 minutes, about 10 and about 20 minutes, about 10 and about 15 minutes, about 15 and about 120 minutes, about 15 and about 60 minutes, about 15 and about 30 minutes, about 15 and about 20 minutes, about 20 and about 120 minutes, about 20 and about 60 minutes, about 20 and about 30 minutes, about 30 and about 120 minutes, about 30 and about 60 minutes, or about 60 and about 120 minutes. In some embodiments, the zinc source and the selenium source are added over a period of about 20 minutes and about 30 minutes.

In some embodiments, the reaction mixture—after addition of a zinc source and a selenium source in (d)—is maintained at an elevated temperature for between about 2 and about 20 minutes, about 2 and about 15 minutes, about 2 and about 10 minutes, about 2 and about 8 minutes, about 2 and about 5 minutes, about 5 and about 20 minutes, about 5 and about 15 minutes, about 5 and about 10 minutes, about 5 and about 8 minutes, about 8 and about 20 minutes, about 8 and about 15 minutes, about 8 and about 10 minutes, about 10 and about 20 minutes, about 10 and about 15 minutes, or about 15 and about 20 minutes. In some embodiments, the reaction mixture—after addition of a zinc source and a selenium source in (d)—is maintained at an elevated temperature for between about 2 and about 10 minutes.

To prevent precipitation of the $ZnSe_{1-x}Te_x$ cores as additional precursors are added, additional ligand can be added during the growth phase. If too much ligand is added during the initial nucleation phase, the concentration of the zinc source, selenium source, and tellurium source would be too low and would prevent effective nucleation. Therefore, the ligand is added slowly throughout the growth phase. In some embodiments, the additional ligand is oleylamine.

After the $ZnSe_{1-x}Te_x$ cores reach the desired thickness and diameter, they can be cooled. In some embodiments, the $ZnSe_{1-x}Te_x$ cores are cooled to room temperature. In some embodiments, an organic solvent is added to dilute the reaction mixture comprising the $ZnSe_{1-x}Te_x$ cores.

In some embodiments, the organic solvent is hexane, pentane, toluene, benzene, diethylether, acetone, ethyl acetate, dichloromethane (methylene chloride), chloroform, dimethylformamide, or N-methylpyrrolidinone. In some embodiments, the organic solvent is toluene.

In some embodiments, the $ZnSe_{1-x}Te_x$ cores are isolated. In some embodiments, the $ZnSe_{1-x}Te_x$ cores are isolated by precipitation of the $ZnSe_{1-x}Te_x$ from solvent. In some embodiments, the $ZnSe_{1-x}Te_x$ cores are isolated by precipitation with ethanol.

The size distribution of the $ZnSe_{1-x}Te_x$ cores prepared using the methods described herein can be relatively narrow. In some embodiments, the photoluminescence spectrum of the population or core/shell(s) nanostructures prepared using the methods described herein have a full width at half-maximum of between about 10 nm and about 30 nm, about 10 nm and about 25 nm, about 10 nm and about 20 nm, about 10 nm and about 22 nm, about 10 nm and about 15 nm, about 15 nm and about 30 nm, about 15 nm and about 25 nm, about 15 nm and about 22 nm, about 15 nm and about 20 nm, about 20 nm and about 30 nm, about 20 nm and about 25 nm, about 20 nm and about 22 nm, about 22 nm and about 30 nm, about 22 nm and about 25 nm, or about 25 nm and about 30 nm. In some embodiments, the photoluminescence spectrum of the population or $ZnSe_{1-x}Te_x$ cores prepared using the methods described herein have a full width at half-maximum of between about 15 nm and about 22 nm.

Production of a Shell

In some embodiments, the nanostructures of the present invention include a core and at least one shell. In some embodiments, the nanostructures of the present invention include a core and at least two shells. The shell can, e.g., increase the quantum yield and/or stability of the nanostructures. In some embodiments, the core and the shell comprise different materials. In some embodiments, the nanostructure comprises shells of different shell material.

In some embodiments, a shell that comprises a mixture of Group II and VI elements is deposited onto a core or a core/shell(s) structure. In some embodiments, the shell deposited is a mixture of at least two of a zinc source, a selenium source, a sulfur source, and a tellurium source. In some embodiments, the shell deposited is a mixture of two of a zinc source, a selenium source, a sulfur source, and a tellurium source. In some embodiments, the shell deposited is a mixture of three of a zinc source, a selenium source, a sulfur source, and a tellurium source. In some embodiments, the shell comprises zinc and sulfur; zinc and selenium; zinc, sulfur, and selenium; zinc and tellurium; zinc, tellurium, and sulfur; or zinc, tellurium, and selenium.

In some embodiments, a shell comprises more than one monolayer of shell material. The number of monolayers is an average for all the nanostructures; therefore, the number of monolayers in a shell may be a fraction. In some embodiments, the number of monolayers in a shell is between about 0.25 and about 10, about 0.25 and about 8, about 0.25 and about 7, about 0.25 and about 6, about 0.25 and about 5, about 0.25 and about 4, about 0.25 and about 3, about 0.25 and about 2, about 2 and about 10, about 2 and about 8, about 2 and about 7, about 2 and about 6, about 2 and about 5, about 2 and about 4, about 2 and about 3, about 3 and about 10, about 3 and about 8, about 3 and about 7, about 3 and about 6, about 3 and about 5, about 3 and about 4, about 4 and about 10, about 4 and about 8, about 4 and about 7, about 4 and about 6, about 4 and about 5, about 5 and about 10, about 5 and about 8, about 5 and about 7, about 5 and about 6, about 6 and about 10, about 6 and about 8, about 6 and about 7, about 7 and about 10, about 7 and about 8, or about 8 and about 10. In some embodiments, the shell comprises between about 3 and about 6 monolayers.

The thickness of the shell can be controlled by varying the amount of precursor provided. For a given shell thickness, at least one of the precursors is optionally provided in an amount whereby, when a growth reaction is substantially complete, a shell of a predetermined thickness is obtained. If more than one different precursor is provided, either the amount of each precursor can be limited or one of the precursors can be provided in a limiting amount while the others are provided in excess.

The thickness of each shell can be determined using techniques known to those of skill in the art. In some embodiments, the thickness of each shell is determined by comparing the average diameter of the nanostructure before and after the addition of each shell. In some embodiments, the average diameter of the nanostructure before and after the addition of each shell is determined by transmission electron microscopy (TEM). In some embodiments, each shell has a thickness of between about 0.05 nm and about 3.5 nm, about 0.05 nm and about 2 nm, about 0.05 nm and about 0.9 nm, about 0.05 nm and about 0.7 nm, about 0.05 nm and about 0.5 nm, about 0.05 nm and about 0.3 nm, about 0.05 nm and about 0.1 nm, about 0.1 nm and about 3.5 nm, about 0.1 nm and about 2 nm, about 0.1 nm and about 0.9 nm, about 0.1 nm and about 0.7 nm, about 0.1 nm and about 0.5 nm, about 0.1 nm and about 0.3 nm, about 0.3 nm and about 3.5 nm, about 0.3 nm and about 2 nm, about 0.3 nm and about 0.9 nm, about 0.3 nm and about 0.7 nm, about 0.3 nm and about 0.5 nm, about 0.5 nm and about 3.5 nm, about 0.5 nm and about 2 nm, about 0.5 nm and about 0.9 nm, about 0.5 nm and about 0.7 nm, about 0.7 nm and about 3.5 nm, about 0.7 nm and about 2 nm, about 0.7 nm and about 0.9 nm, about 0.9 nm and about 3.5 nm, about 0.9 nm and about 2 nm, or about 2 nm and about 3.5 nm.

In some embodiments, each shell is synthesized in the presence of at least one nanostructure ligand. Ligands can, e.g., enhance the miscibility of nanostructures in solvents or polymers (allowing the nanostructures to be distributed throughout a composition such that the nanostructures do not aggregate together), increase quantum yield of nanostructures, and/or preserve nanostructure luminescence (e.g., when the nanostructures are incorporated into a matrix). In some embodiments, the ligand(s) for the core synthesis and for the shell synthesis are the same. In some embodiments, the ligand(s) for the core synthesis and for the shell synthesis are different. Following synthesis, any ligand on the surface of the nanostructures can be exchanged for a different ligand with other desirable properties. Examples of ligands are disclosed in U.S. Pat. Nos. 7,572,395, 8,143,703, 8,425,803, 8,563, 133, 8,916,064, 9,005,480, 9,139,770, and 9,169,435, and in U.S. Patent Appl. Publication No. 2008/0118755.

Ligands suitable for the synthesis of a shell are known by those of skill in the art. In some embodiments, the ligand is a fatty acid selected from the group consisting of lauric acid, caproic acid, caprylic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from the group consisting of dodecylamine, oleylamine, hexadecylamine, dioctylamine, and octadecylamine. In some embodiments, the ligand is trioctylphosphine oxide, trioctylphosphine, or lauric acid.

In some embodiments, each shell is produced in the presence of a mixture of ligands. In some embodiments, each shell is produced in the presence of a mixture comprising 2, 3, 4, 5, or 6 different ligands. In some embodiments, each shell is produced in the presence of a mixture comprising 3 different ligands. In some embodiments, the mixture of ligands comprises tributylphosphine oxide, trioctylphosphine, and lauric acid.

In some embodiments, each shell is produced in the presence of a solvent. In some embodiments, the solvent is selected from the group consisting of 1-octadecene, 1-hexadecene, 1-eicosene, eicosane, octadecane, hexadecane, tetradecane, squalene, squalane, trioctylphosphine oxide, and dioctyl ether.

In some embodiments, a core or a core/shell(s) and shell precursor are admixed at an temperature between about 20° C. and about 310° C., about 20° C. and about 280° C., about 20° C. and about 250° C., about 20° C. and about 200° C., about 20° C. and about 150° C., about 20° C. and about 100° C., about 20° C. and about 50° C., about 50° C. and about 310° C., about 50° C. and about 280° C., about 50° C. and about 250° C., about 50° C. and about 200° C., about 50° C. and about 150° C., about 50° C. and about 100° C., about 100° C. and about 310° C., about 100° C. and about 280° C., about 100° C. and about 250° C., about 100° C. and about 200° C., about 100° C. and about 150° C., about 150° C. and about 310° C., about 150° C. and about 280° C., about 150° C. and about 250° C., about 150° C. and about 200° C., about 200° C. and about 310° C., about 200° C. and about 280° C., about 200° C. and about 250° C., about 250° C. and about 310° C., about 250° C. and about 280° C., or about 280° C. and about 310° C.

In some embodiments, after admixing a core or core/shell (s) and shell precursor, the temperature of the reaction mixture is increased to an elevated temperature between about 200° C. and about 310° C., about 200° C. and about 280° C., about 200° C. and about 250° C., about 200° C. and about 220° C., about 220° C. and about 310° C., about 220° C. and about 280° C., about 220° C. and about 250° C., about 250° C. and about 310° C., about 250° C. and about 280° C., or about 280° C. and about 310° C.

In some embodiments, after admixing a core or core/shell (s) and shell precursor, the time for the temperature to reach the elevated temperature is between about 2 and about 240 minutes, about 2 and about 200 minutes, about 2 and about 100 minutes, about 2 and about 60 minutes, about 2 and about 40 minutes, about 5 and about 240 minutes, about 5 and about 200 minutes, about 5 and about 100 minutes, about 5 and about 60 minutes, about 5 and about 40 minutes, about 10 and about 240 minutes, about 10 and about 200 minutes, about 10 and about 100 minutes, about 10 and about 60 minutes, about 10 and about 40 minutes, about 40 and about 240 minutes, about 40 and about 200 minutes, about 40 and about 100 minutes, about 40 and about 60 minutes, about 60 and about 240 minutes, about 60 and about 200 minutes, about 60 and about 100 minutes, about 100 and about 240 minutes, about 100 and about 200 minutes, or about 200 and about 240 minutes.

In some embodiments, after admixing a core or core/shell (s) and shell precursor, the temperature of the reaction mixture is maintained at an elevated temperature for between 2 and about 240 minutes, about 2 and about 200 minutes, about 2 and about 100 minutes, about 2 and about 60 minutes, about 2 and about 40 minutes, about 5 and about 240 minutes, about 5 and about 200 minutes, about 5 and about 100 minutes, about 5 and about 60 minutes, about 5 and about 40 minutes, about 10 and about 240 minutes, about 10 and about 200 minutes, about 10 and about 100 minutes, about 10 and about 60 minutes, about 10 and about 40 minutes, about 40 and about 240 minutes, about 40 and about 200 minutes, about 40 and about 100 minutes, about 40 and about 60 minutes, about 60 and about 240 minutes, about 60 and about 200 minutes, about 60 and about 100 minutes, about 100 and about 240 minutes, about 100 and about 200 minutes, or about 200 and about 240 minutes.

In some embodiments, additional shells are produced by further additions of shell material precursors that are added to the reaction mixture followed by maintaining at an elevated temperature. Typically, additional shell precursor is provided after reaction of the previous shell is substantially complete (e.g., when at least one of the previous precursors is depleted or removed from the reaction or when no additional growth is detectable). The further additions of precursor create additional shells.

In some embodiments, the nanostructure is cooled before the addition of additional shell material precursor to provide further shells. In some embodiments, the nanostructure is maintained at an elevated temperature before the addition of shell material precursor to provide further shells.

After sufficient layers of shell have been added for the nanostructure to reach the desired thickness and diameter, the nanostructure can be cooled. In some embodiments, the core/shell(s) nanostructures are cooled to room temperature. In some embodiments, an organic solvent is added to dilute the reaction mixture comprising the core/shell(s) nanostructures.

In some embodiments, the organic solvent used to dilute the reaction mixture is ethanol, hexane, pentane, toluene, benzene, diethylether, acetone, ethyl acetate, dichloromethane (methylene chloride), chloroform, dimethylformamide, or N-methylpyrrolidinone. In some embodiments, the organic solvent is toluene.

In some embodiments, core/shell(s) nanostructures are isolated. In some embodiments, the core/shell(s) nanostructures are isolated by precipitation using an organic solvent. In some embodiments, the core/shell(s) nanostructures are isolated by flocculation with ethanol.

The number of monolayers will determine the size of the core/shell(s) nanostructures. The size of the core/shell(s) nanostructures can be determined using techniques known to those of skill in the art. In some embodiments, the size of the core/shell(s) nanostructures is determined using TEM. In some embodiments, the core/shell(s) nanostructures have an average diameter of between about 1 nm and about 15 nm, about 1 nm and about 10 nm, about 1 nm and about 9 nm, about 1 nm and about 8 nm, about 1 nm and about 7 nm, about 1 nm and about 6 nm, about 1 nm and about 5 nm, about 5 nm and about 15 nm, about 5 nm and about 10 nm, about 5 nm and about 9 nm, about 5 nm and about 8 nm, about 5 nm and about 7 nm, about 5 nm and about 6 nm, about 6 nm and about 15 nm, about 6 nm and about 10 nm, about 6 nm and about 9 nm, about 6 nm and about 8 nm, about 6 nm and about 7 nm, about 7 nm and about 15 nm, about 7 nm and about 10 nm, about 7 nm and about 9 nm, about 7 nm and about 8 nm, about 8 nm and about 15 nm, about 8 nm and about 10 nm, about 8 nm and about 9 nm, about 9 nm and about 15 nm, about 9 nm and about 10 nm, or about 10 nm and about 15 nm.

In some embodiments, the core/shell(s) nanostructure is subjected to an acid etching step before deposition of an additional shell.

Production of a ZnSe Shell

In some embodiments, the shell deposited onto the core or core/shell(s) nanostructure is a ZnSe shell.

In some embodiments, the shell precursors contacted with a core or core/shell(s) nanostructure to prepare a ZnSe shell comprise a zinc source and a selenium source.

In some embodiments, the zinc source is a dialkyl zinc compound. In some embodiments, the zinc source is a zinc carboxylate. In some embodiments, the zinc source is diethylzinc, dimethylzinc, zinc acetate, zinc acetylacetonate, zinc iodide, zinc bromide, zinc chloride, zinc fluoride, zinc carbonate, zinc cyanide, zinc nitrate, zinc oleate, zinc oxide, zinc peroxide, zinc perchlorate, zinc sulfate, zinc hexanoate, zinc octanoate, zinc laurate, zinc myristate, zinc palmitate, zinc stearate, zinc dithiocarbamate, or mixtures thereof. In some embodiments, the zinc source is zinc oleate, zinc hexanoate, zinc octanoate, zinc laurate, zinc myristate, zinc palmitate, zinc stearate, zinc dithiocarbamate, or mixtures thereof. In some embodiments, the zinc source is zinc oleate.

In some embodiments, the selenium source is an alkyl-substituted selenourea. In some embodiments, the selenium source is a phosphine selenide. In some embodiments, the selenium source is selected from trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, tricyclohexylphosphine selenide, cyclohexylphosphine selenide, 1-octaneselenol, 1-dodecaneselenol, selenophenol, elemental selenium, hydrogen selenide, bis(trimethylsilyl) selenide, selenourea, and mixtures thereof. In some embodiments, the selenium source is tri(n-butyl)phosphine selenide, tri(sec-butyl)phosphine selenide, or tri(tert-butyl)phosphine selenide. In some embodiments, the selenium source is trioctylphosphine selenide.

In some embodiments, the molar ratio of core to zinc source to prepare a ZnSe shell is between about 1:2 and about 1:1000, about 1:2 and about 1:100, about 1:2 and about 1:50, about 1:2 and about 1:25, about 1:2 and about 1:15, about 1:2 and about 1:10, about 1:2 and about 1:5, about 1:5 and about 1:1000, about 1:5 and about 1:100, about 1:5 and about 1:50, about 1:5 and about 1:25, about 1:5 and about 1:15, about 1:5 and about 1:10, about 1:10 and about 1:1000, about 1:10 and about 1:100, about 1:10 and about 1:50, about 1:10 and about 1:25, about 1:10 and about 1:15, about 1:15 and about 1:1000, about 1:15 and about 1:100, about 1:15 and about 1:50, about 1:15 and about 1:25, about 1:25 and about 1:1000, about 1:25 and about 1:100, about 1:25 and about 1:50, about 1:50 and about 1:1000, about 1:50 and about 1:100, or about 1:100 and about 1:1000.

In some embodiments, the molar ratio of core to selenium source to prepare a ZnSe shell is between about 1:2 and about 1:1000, about 1:2 and about 1:100, about 1:2 and about 1:50, about 1:2 and about 1:25, about 1:2 and about 1:15, about 1:2 and about 1:10, about 1:2 and about 1:5, about 1:5 and about 1:1000, about 1:5 and about 1:100, about 1:5 and about 1:50, about 1:5 and about 1:25, about 1:5 and about 1:15, about 1:5 and about 1:10, about 1:10 and about 1:1000, about 1:10 and about 1:100, about 1:10 and about 1:50, about 1:10 and about 1:25, about 1:10 and about 1:15, about 1:15 and about 1:1000, about 1:15 and about 1:100, about 1:15 and about 1:50, about 1:15 and about 1:25, about 1:25 and about 1:1000, about 1:25 and about 1:100, about 1:25 and about 1:50, about 1:50 and about 1:1000, about 1:50 and about 1:100, or about 1:100 and about 1:1000.

In some embodiments, the number of monolayers in a ZnSe shell is between about 0.25 and about 10, about 0.25 and about 8, about 0.25 and about 7, about 0.25 and about 6, about 0.25 and about 5, about 0.25 and about 4, about 0.25 and about 3, about 0.25 and about 2, about 2 and about 10, about 2 and about 8, about 2 and about 7, about 2 and about 6, about 2 and about 5, about 2 and about 4, about 2 and about 3, about 3 and about 10, about 3 and about 8, about 3 and about 7, about 3 and about 6, about 3 and about 5, about 3 and about 4, about 4 and about 10, about 4 and about 8, about 4 and about 7, about 4 and about 6, about 4 and about 5, about 5 and about 10, about 5 and about 8, about 5 and about 7, about 5 and about 6, about 6 and about 10, about 6 and about 8, about 6 and about 7, about 7 and about 10, about 7 and about 8, or about 8 and about 10. In some embodiments, the ZnSe shell comprises between 2 and 8 monolayers. In some embodiments, the ZnSe shell comprises between 4 and 6 monolayers.

In some embodiments, a ZnSe monolayer has a thickness of about 0.328 nm.

In some embodiments, a ZnSe shell has a thickness of between about 0.08 nm and about 3.5 nm, about 0.08 nm and about 2 nm, about 0.08 nm and about 0.9 nm, about 0.08 nm and about 0.7 nm, about 0.08 nm and about 0.5 nm, about 0.08 nm and about 0.2 nm, about 0.2 nm and about 3.5 nm, about 0.2 nm and about 2 nm, about 0.2 nm and about 0.9 nm, about 0.2 nm and about 0.7 nm, about 0.2 nm and about 0.5 nm, about 0.5 nm and about 3.5 nm, about 0.5 nm and about 2 nm, about 0.5 nm and about 0.9 nm, about 0.5 nm and about 0.7 nm, about 0.7 nm and about 3.5 nm, about 0.7 nm and about 2 nm, about 0.7 nm and about 0.9 nm, about 0.9 nm and about 3.5 nm, about 0.9 nm and about 2 nm, or about 2 nm and about 3.5 nm.

Production of a ZnS Shell

In some embodiments, the shell deposited onto the core or core/shell(s) nanostructure is a ZnS shell.

In some embodiments, the shell precursors contacted with a core or core/shell(s) nanostructure to prepare a ZnS shell comprise a zinc source and a sulfur source.

In some embodiments, the ZnS shell passivates defects at the particle surface, which leads to an improvement in the quantum yield and to higher efficiencies when used in devices such as LEDs and lasers. Furthermore, spectral impurities which are caused by defect states may be eliminated by passivation, which increases the color saturation.

In some embodiments, the zinc source is a dialkyl zinc compound. In some embodiments, the zinc source is a zinc carboxylate. In some embodiments, the zinc source is diethylzinc, dimethylzinc, zinc acetate, zinc acetylacetonate, zinc iodide, zinc bromide, zinc chloride, zinc fluoride, zinc carbonate, zinc cyanide, zinc nitrate, zinc oleate, zinc oxide, zinc peroxide, zinc perchlorate, zinc sulfate, zinc hexanoate, zinc octanoate, zinc laurate, zinc myristate, zinc palmitate, zinc stearate, zinc dithiocarbamate, or mixtures thereof. In some embodiments, the zinc source is zinc oleate, zinc hexanoate, zinc octanoate, zinc laurate, zinc myristate, zinc palmitate, zinc stearate, zinc dithiocarbamate, or mixtures thereof. In some embodiments, the zinc source is zinc oleate.

In some embodiments, the sulfur source is selected from elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trioctylphosphine sulfide, and mixtures thereof. In some embodiments, the sulfur source is an alkyl-substituted zinc dithiocarbamate. In some embodiments, the sulfur source is octanethiol. In some embodiments, the sulfur source is tributylphosphine sulfide.

In some embodiments, the molar ratio of core to zinc source to prepare a ZnS shell is between about 1:2 and about 1:1000, about 1:2 and about 1:100, about 1:2 and about 1:50, about 1:2 and about 1:25, about 1:2 and about 1:15, about 1:2 and about 1:10, about 1:2 and about 1:5, about 1:5 and about 1:1000, about 1:5 and about 1:100, about 1:5 and about 1:50, about 1:5 and about 1:25, about 1:5 and about 1:15, about 1:5 and about 1:10, about 1:10 and about 1:1000, about 1:10 and about 1:100, about 1:10 and about 1:50, about 1:10 and about 1:25, about 1:10 and about 1:15, about 1:15 and about 1:1000, about 1:15 and about 1:100, about 1:15 and about 1:50, about 1:15 and about 1:25, about 1:25 and about 1:1000, about 1:25 and about 1:100, about 1:25 and about 1:50, about 1:50 and about 1:1000, about 1:50 and about 1:100, or about 1:100 and about 1:1000.

In some embodiments, the molar ratio of core to sulfur source to prepare a ZnS shell is between about 1:2 and about 1:1000, about 1:2 and about 1:100, about 1:2 and about 1:50, about 1:2 and about 1:25, about 1:2 and about 1:15, about 1:2 and about 1:10, about 1:2 and about 1:5, about 1:5 and about 1:1000, about 1:5 and about 1:100, about 1:5 and about 1:50, about 1:5 and about 1:25, about 1:5 and about 1:15, about 1:5 and about 1:10, about 1:10 and about 1:1000, about 1:10 and about 1:100, about 1:10 and about 1:50, about 1:10 and about 1:25, about 1:10 and about 1:15, about 1:15 and about 1:1000, about 1:15 and about 1:100, about 1:15 and about 1:50, about 1:15 and about 1:25, about 1:25 and about 1:1000, about 1:25 and about 1:100, about 1:25 and about 1:50, about 1:50 and about 1:1000, about 1:50 and about 1:100, or about 1:100 and about 1:1000.

In some embodiments, the number of monolayers in a ZnS shell is between about 0.25 and about 10, about 0.25 and about 8, about 0.25 and about 7, about 0.25 and about 6, about 0.25 and about 5, about 0.25 and about 4, about 0.25 and about 3, about 0.25 and about 2, about 2 and about 10, about 2 and about 8, about 2 and about 7, about 2 and about 6, about 2 and about 5, about 2 and about 4, about 2 and about 3, about 3 and about 10, about 3 and about 8, about 3 and about 7, about 3 and about 6, about 3 and about 5, about 3 and about 4, about 4 and about 10, about 4 and about 8, about 4 and about 7, about 4 and about 6, about 4 and about 5, about 5 and about 10, about 5 and about 8, about 5 and about 7, about 5 and about 6, about 6 and about 10, about 6 and about 8, about 6 and about 7, about 7 and about 10, about 7 and about 8, or about 8 and about 10. In some embodiments, the ZnS shell comprises between 2 and 8 monolayers. In some embodiments, the ZnS shell comprises between 4 and 6 monolayers.

In some embodiments, a ZnS monolayer has a thickness of about 0.31 nm.

In some embodiments, a ZnS shell has a thickness of between about 0.08 nm and about 3.5 nm, about 0.08 nm and about 2 nm, about 0.08 nm and about 0.9 nm, about 0.08 nm and about 0.7 nm, about 0.08 nm and about 0.5 nm, about 0.08 nm and about 0.2 nm, about 0.2 nm and about 3.5 nm, about 0.2 nm and about 2 nm, about 0.2 nm and about 0.9 nm, about 0.2 nm and about 0.7 nm, about 0.2 nm and about 0.5 nm, about 0.5 nm and about 3.5 nm, about 0.5 nm and about 2 nm, about 0.5 nm and about 0.9 nm, about 0.5 nm and about 0.7 nm, about 0.7 nm and about 3.5 nm, about 0.7 nm and about 2 nm, about 0.7 nm and about 0.9 nm, about 0.9 nm and about 3.5 nm, about 0.9 nm and about 2 nm, or about 2 nm and about 3.5 nm.

Core/Shell(s) Nanostructures

In some embodiments, the core/shell(s) nanostructure is a $ZnSe_{1-x}Te_x/ZnSe/ZnS$ core/shell nanostructure. In some embodiments, the core/shell(s) nanostructure is a $ZnSe_{1-x}Te_x/ZnSe/ZnS$ core/shell quantum dot.

In some embodiments, the core/shell(s) nanostructures display a high photoluminescence quantum yield. In some embodiments, the core/shell(s) nanostructures display a photoluminescence quantum yield of between about 30% and about 99%, about 30% and about 95%, about 30% and about 90%, about 30% and about 85%, about 30% and about 80%, about 30% and about 60%, about 30% and about 50%, about 30% and about 40%, about 40% and about 99%, about 40% and about 95%, about 40% and about 90%, about 40% and about 85%, about 40% and about 80%, about 40% and about 60%, about 40% and about 50%, about 50% and about 99%, about 50% and about 95%, about 50% and about 90%, about 50% and about 85%, about 60% and about 99%, about 60% and about 95%, about 60% and about 85%, about 80% and about 99%, about 80% and about 90%, about 80% and about 85%, about 85% and about 99%, or about 85% and about 95%. In some embodiments, the core/shell(s) nanostructures display a photoluminescence quantum yield of between about 50% and about 60%. In some embodiments, the core/shell(s) nanostructures display a photoluminescence quantum yield of between about 75% and about 90%.

In some embodiments, the photoluminescence spectrum for the core/shell(s) nanostructures have a emission maximum between about 300 nm and about 590 nm, about 300 nm and about 550 nm, about 300 nm and about 450 nm, about 450 nm and about 590 nm, about 450 nm and about 550 nm, or about 550 nm and about 590. In some embodiments, the photoluminescence spectrum for the core/shell(s) nanostructures has an emission maximum of between about 420 nm and about 480 nm. In some embodiments, the photoluminescence spectrum for the core/shell(s) nanostructures has an emission maximum of between about 440 nm and about 460 nm. In some embodiments, the photoluminescence spectrum for the core/shell(s) nanostructures has an emission maximum of between about 450 nm and about 460 nm.

The size distribution of the core/shell(s) nanostructures can be relatively narrow. In some embodiments, the photoluminescence spectrum of the population or core/shell(s) nanostructures can have a full width at half-maximum of between about 10 nm and about 30 nm, about 10 nm and about 25 nm, about 10 nm and about 20 nm, about 10 nm and about 22 nm, about 10 nm and about 15 nm, about 15 nm and about 30 nm, about 15 nm and about 25 nm, about 15 nm and about 22 nm, about 15 nm and about 20 nm, about 20 nm and about 30 nm, about 20 nm and about 25 nm, about 20 nm and about 22 nm, about 22 nm and about 30 nm, about 22 nm and about 25 nm, or about 25 nm and about 30 nm. In some embodiments, the photoluminescence spectrum of the population of core/shell(s) nanostructures can have a full width at half-maximum of between about 15 nm and about 22 nm. In some embodiments, the photoluminescence spectrum of the population of core/shell(s) nanostructures can have a full width at half-maximum of between about 20 nm to about 30 nm.

Nanostructure Film

In some embodiments, the core/shell(s) nanostructures prepared by the method described herein are incorporated into a nanostructure film. In some embodiments, the nanostructure film is incorporated into a quantum dot enhancement film (QDEF).

In some embodiments, the present disclosure provides a nanostructure film comprising at least one population of nanostructures, wherein the nanostructure comprise a core surrounded by at least one shell, wherein the core comprises $ZnSe_{1-x}Te_x$, wherein $0<x<1$, wherein the at least one shell comprises ZnS or ZnSe, and wherein the full width at half maximum (FWHM) of the nanostructure is about 20 nm to about 30 nm.

In some embodiments, the nanostructure is a quantum dot.

In some embodiments, the present disclosure provides a nanostructure film comprising:
(a) at least one population of nanostructures, wherein the nanostructures comprise a core surrounded by at least one shell, wherein the core comprises $ZnSe_{1-x}Te_x$, wherein $0<x<1$, wherein the at least one shell comprises ZnS or ZnSe, and wherein the full width at half maximum (FWHM) of the nanostructure is about 20 nm to about 30 nm; and
(b) at least one organic resin.

In some embodiments, the nanostructure is a quantum dot.

In some embodiments, the core/shell(s) nanostructures are embedded in a matrix. As used herein, the term "embedded" is used to indicate that the nanostructures are enclosed or encased within a matrix material that makes up the majority component of the matrix. In some embodiments, the nanostructures are uniformly distributed throughout the matrix material. In some embodiments, the nanostructures are distributed according to an application-specific uniformity distribution function.

In some embodiments, the nanostructures can include a homogenous population having sizes that emit in the blue visible wavelength spectrum, in the green visible wavelength spectrum, or in the red visible wavelength spectrum. In some embodiments, the nanostructures can include a first population of nanostructures having sizes that emit in the blue visible wavelength spectrum, a second population of nanostructures having sizes that emit in the green visible wavelength spectrum, and a third population of nanostructures having sizes that emit in the red visible wavelength spectrum.

The matrix material can be any suitable host matrix material capable of housing nanostructures. Suitable matrix materials can be chemically and optically compatible with nanostructures and any surrounding packaging materials or layers used in applying a nanostructure film to devices. Suitable matrix materials can include non-yellowing optical materials that are transparent to both the primary and secondary light, thereby allowing for both primary and secondary light to transmit through the matrix material. Matrix materials can include polymers and organic and inorganic oxides. Suitable polymers for use in the matrix material can be any polymer known to the ordinarily skilled artisan that can be used for such a purpose. The polymer can be substantially translucent or substantially transparent. Matrix materials can include, but not limited to, epoxies, acrylates, norbornene, polyethylene, poly(vinyl butyral): poly(vinyl acetate), polyurea, polyurethanes; silicones and silicone derivatives including, but not limited to, amino silicone (AMS), polyphenylmethylsiloxane, polyphenylalkylsiloxane, polydiphenylsiloxane, polydialkylsiloxane, silsesquioxanes, fluorinated silicones, and vinyl and hydride substituted silicones; acrylic polymers and copolymers formed from monomers including, but not limited to, methylmethacrylate, butylmethacrylate, and laurylmethacrylate; styrene-based polymers such as polystyrene, amino polystyrene (APS), and poly(acrylonitrile ethylene styrene) (AES); polymers that are cross-linked with bifunctional monomers, such as divinylbenzene; cross-linkers suitable for cross-linking ligand materials, epoxides that combine with ligand amines (e.g., APS or polyethylene imine ligand amines) to form epoxy, and the like.

In some embodiments, the matrix material includes scattering microbeads such as $TiO_2$ microbeads, ZnS microbeads, or glass microbeads that can improve photo conversion efficiency of the nanostructure film. In some embodiments, the matrix material can include light blocking elements.

In some embodiments, the matrix material can have low oxygen and moisture permeability, exhibit high photo- and chemical-stability, exhibit favorable refractive indices, and adhere to outer surfaces of the nanostructures, thus providing an air-tight seal to protect the nanostructures. In another embodiment, the matrix material can be curable with UV or thermal curing methods to facilitate roll-to-roll processing.

In some embodiments, a nanostructure film can be formed by mixing nanostructures in a polymer (e.g., photoresist) and casting the nanostructure-polymer mixture on a substrate, mixing the nanostructures with monomers and polymerizing them together, mixing nanostructures in a sol-gel to form an oxide, or any other method known to those skilled in the art.

In some embodiments, the formation of a nanostructure film can include a film extrusion process. The film extrusion process can include forming a homogenous mixture of matrix material and barrier layer coated core-shell nanostructures such as nanostructures functionalized with a metal halide and/or a metal carboxylate, introducing the homogenous mixture into a top mounted hopper that feeds into an extruder. In some embodiments, the homogenous mixture can be in the form of pellets. The film extrusion process can further include extruding a nanostructure film from a slot die and passing an extruded nanostructure film through chill rolls. In some embodiments, the extruded nanostructure film can have a thickness less than about 75 µm, for example, in a range from about 70 µm to about 40 µm, about 65 µm to about 40 µm, about 60 µm to about 40 µm, or about 50 µm to about 40 µm. In some embodiments, the nanostructure film has a thickness less than about 10 µm. In some embodiments, the formation of the nanostructure film can optionally include a secondary process followed by the film extrusion process. The secondary process can include a process such as co-extrusion, thermoforming, vacuum forming, plasma treatment, molding, and/or embossing to provide a texture to a top surface of the nanostructure film layer. The textured top surface nanostructure film can help to improve, for example defined optical diffusion property and/or defined angular optical emission property of the nanostructure film.

Quantum Dot on Glass LCD Display Device

In some embodiments, the nanostructure film is incorporated into a quantum dot on glass LCD display device. A LCD display device can include a nanostructure film formed directly on a light guide plate (LGP) without necessitating an intermediate substrate or barrier layer. In some embodiments, a nanostructure film can be a thin film. In some embodiments, a nanostructure film can have a thickness of 500 µm or less, 100 µm or less, or 50 µm or less. In some embodiments, a nanostructure film is a thin film having a thickness of about 15 µm or less.

A LGP can include an optical cavity having one or more sides, including at least a top side, comprising glass. Glass provides excellent resistance to impurities including moisture and air. Moreover, glass can be formed as a thin substrate while maintaining structural rigidity. Therefore, a LGP can be formed at least partially of a glass surface to provide a substrate having sufficient barrier and structural properties.

In some embodiments, a nanostructure film can be formed on a LGP. In some embodiments, the nanostructure film comprises a population of nanostructures embedded in a matrix material, such as a resin. A nanostructure film can be formed on a LGP by any method known in the art, such as wet coating, painting, spin coating, or screen printing. After deposition, a resin of a nanostructure film can be cured. In some embodiments a resin of one or more nanostructure films can be partially cured, further processed and then finally cured. The nanostructure films can be deposited as one layer or as separate layers, and the separate layers can comprise varying properties. The width and height of the nanostructure films can be any desired dimensions, depending on the size of the viewing panel of the display device. For example, the nanostructure films can have a relatively small surface area in small display device embodiments such as watches and phones, or the nanostructure films can have a large surface area for large display device embodiments such as TVs and computer monitors.

In some embodiments, an optically transparent substrate is formed on a nanostructure film by any method known in the art, such as vacuum deposition, vapor deposition, or the like. An optically transparent substrate can be configured to provide environmental sealing to the underlying layers and/or structures of the nanostructure film. In some embodiments, light blocking elements can be included in the optically transparent substrate. In some embodiments, light blocking elements can be included in a second polarizing filter, which can be positioned between the substrate and the nanostructure film. In some embodiments, light blocking elements can be dichroic filters that, for example, can reflect the primary light (e.g., blue light, UV light, or combination of UV light and blue light) while transmitting the secondary light. Light blocking elements can include specific UV light filtering components to remove any unconverted UV light from the red and green sub-pixels, and/or the UV light from the blue sub-pixels.

On-Chip and Near Chip Placement of Quantum Dots

In some embodiments, the nanostructures are incorporated into display devices by "on-chip" placements. As used herein, "on-chip" refers to placing nanostructures into an LED cup. In some embodiments, the nanostructures are dissolved in a resin or a fluid to fill the LED cup.

In some embodiments, the nanostructures are incorporated into display devices by "near-chip" placements. As used herein, "near-chip" refers to coating the top surface of the LED assembly with nanostructures such that the outgoing light passes through the nanostructure film.

Display Device with Nanostructure Color Conversion Layer

In some embodiments, the present invention provides a display device comprising:
 (a) a display panel to emit a first light;
 (b) a backlight unit configured to provide the first light to the display panel; and
 (c) a color filter comprising at least one pixel region comprising a color conversion layer.

In some embodiments, the color filter comprises at least 1, 2, 3, 4, 5, 6, 7, 8, 9, or 10 pixel regions. In some embodiments, when blue light is incident on the color filter, red light, white light, green light, and/or blue light may be respectively emitted through the pixel regions. In some embodiments, the color filter is described in U.S. Patent Appl. Publication No. 2017/153366, which is incorporated herein by reference in its entirety.

In some embodiments, each pixel region includes a color conversion layer. In some embodiments, a color conversion layer comprises nanostructures described herein configured to convert incident light into light of a first color. In some embodiments, the color conversion layer comprises nanostructures described herein configured to convert incident light into blue light.

In some embodiments, the display device comprises 1, 2, 3, 4, 5, 6, 7, 8, 9, or 10 color conversion layers. In some embodiments, the display device comprises 1 color conversion layer comprising the nanostructures described herein. In some embodiments, the display device comprises 2 color conversion layers comprising the nanostructures described herein. In some embodiments, the display device comprises 3 color conversion layers comprising the nanostructures described herein. In some embodiments, the display device comprises 4 color conversion layers comprising the nanostructures described herein. In some embodiments, the display device comprises at least one red color conversion layer, at least one green color conversion layer, and at least one blue color conversion layer.

In some embodiments, the color conversion layer has a thickness between about 3 µm and about 10 µm, about 3 µm and about 8 µm, about 3 µm and about 6 µm, about 6 µm and about 10 µm, about 6 µm and about 8 µm, or about 8 µm and about 10 µm. In some embodiments, the color conversion layer has a thickness between about 3 µm and about 10 µm.

The nanostructure color conversion layer can be deposited by any suitable method known in the art, including but not limited to painting, spray coating, solvent spraying, wet coating, adhesive coating, spin coating, tape-coating, roll coating, flow coating, inkjet printing, photoresist patterning, drop casting, blade coating, mist deposition, or a combination thereof. In some embodiments, the nanostructure color conversion layer is deposited by photoresist patterning. In some embodiments, nanostructure color conversion layer is deposited by inkjet printing.

Inkjet Printing

The formation of thin films using dispersions of nanostructures in organic solvents is often achieved by coating techniques such as spin coating. However, these coating techniques are generally not suitable for the formation of thin films over a large area and do not provide a means to pattern the deposited layer and thus, are of limited use. Inkjet printing allows for precisely patterned placement of thin films on a large scale at low cost. Inkjet printing also allows for precise patterning of nanostructure layers, allows printing pixels of a display, and eliminates photopatterning. Thus, inkjet printing is very attractive for industrial application-particularly in display applications.

Solvents commonly used for inkjet printing are dipropylene glycol monomethyl ether acetate (DPMA), polyglycidyl methacrylate (PGMA), diethylene glycol monoethyl ether acetate (EDGAC), and propylene glycol methyl ether acetate (PGMEA). Volatile solvents are also frequently used in inkjet printing because they allow rapid drying. Volatile solvents include ethanol, methanol, 1-propanol, 2-propanol, acetone, methyl ethyl ketone, methyl isobutyl ketone, ethyl acetate, and tetrahydrofuran. Conventional nanostructures generally cannot be dissolved in these solvents. However, the increased hydrophilicity of the nanostructures described herein allows for increased solubility in these solvents.

In some embodiments, the nanostructures described herein used for inkjet printing are dispersed in a solvent selected from DPMA, PGMA, EDGAC, PGMEA, ethanol, methanol, 1-propanol, 2-propanol, acetone, methyl ethyl ketone, methyl isobutyl ketone, ethyl acetate, tetrahydrofuran, chloroform, chlorobenzene, cyclohexane, hexane, heptane, octane, hexadecane, undecane, decane, dodecane, xylene, toluene, benzene, octadecane, tetradecane, butyl ether, or combinations thereof. In some embodiments, the nanostructures comprising a poly(alkylene oxide) ligands described herein used for inkjet printing are dispersed in a solvent selected from DPMA, PGMA, EDGAC, PGMEA, ethanol, methanol, 1-propanol, 2-propanol, acetone, methyl ethyl ketone, methyl isobutyl ketone, ethyl acetate, tetrahydrofuran, or combinations thereof.

In order to be applied by inkjet printing or microdispensing, the inkjet compositions comprising nanostructures should be dissolved in a suitable solvent. The solvent must be able to disperse the nanostructure composition and must not have any detrimental effect on the chosen print head.

In some embodiments, the inkjet composition further comprises one or more additional components such as surface-active compounds, lubricating agents, wetting agents, dispersing agents, hydrophobing agents, adhesive agents, flow improvers, defoaming agents, deaerators, diluents, auxiliaries, colorants, dyes, pigments, sensitizers, stabilizers, and inhibitors.

In some embodiments, the nanostructure compositions described herein comprise by weight of the inkjet composition between about 0.01% and about 20%. In some embodiments, the nanostructures described herein comprise by weight of the inkjet composition between about 0.01% and about 20%, about 0.01% and about 15%, about 0.01% and about 10%, about 0.01% and about 5%, about 0.01% and about 2%, about 0.01% and about 1%, about 0.01% and about 0.1%, about 0.01% and about 0.05%, about 0.05% and about 20%, about 0.05% and about 15%, about 0.05% and about 10%, about 0.05% and about 5%, about 0.05% and about 2%, about 0.05% and about 1%, about 0.05% and about 0.1%, about 0.1% and about 20%, about 0.1% and about 15%, about 0.1% and about 10%, about 0.1% and about 5%, about 0.1% and about 2%, about 0.1% and about 1%, about 0.5% and about 20%, about 0.5% and about 15%, about 0.5% and about 10%, about 0.5% and about 5%, about 0.5% and about 2%, about 0.5% and about 1%, about 1% and about 20%, about 1% and about 15%, about 1% and about 10%, about 1% and about 5%, about 1% and about 2%, about 2% and about 20%, about 2% and about 15%, about 2% and about 10%, about 2% and about 5%, about 5% and about 20%, about 5% and about 15%, about 5% and about 10%, about 10% and about 20%, about 10% and about 15%, or about 15% and 20%.

In some embodiments, the inkjet composition comprising a nanostructure or a nanostructure composition described herein is used in the formulation of an electronic device. In some embodiments, the inkjet composition comprising a nanostructure or a nanostructure composition described herein is used in the formulation of an electronic device selected from the group consisting of a nanostructure film, a display device, a lighting device, a backlight unit, a color filter, a surface light-emitting device, an electrode, a magnetic memory device, and a battery. In some embodiments, the inkjet composition comprising a nanostructure composition described herein is used in the formulation of a light-emitting device.

Nanostructure Molded Article

In some embodiments, the nanostructure composition is used to form a nanostructure molded article. In some embodiments, the nanostructure molded article is a liquid crystal display (LCD) or a light emitting diode (LED). In some embodiments, the nanostructure composition is used to form the emitting layer of an illumination device. The illumination device can be used in a wide variety of applications, such as flexible electronics, touchscreens, monitors, televisions, cellphones, and any other high definition displays. In some embodiments, the illumination device is a light emitting diode or a liquid crystal display. In some embodiments, the illumination device is a quantum dot light emitting diode (QLED). An example of a QLED is disclosed in U.S. patent application Ser. No. 15/824,701, which is incorporated herein by reference in its entirety.

In some embodiments, the present disclosure provides a light emitting diode comprising:
  (a) a first conductive layer;
  (b) a second conductive layer; and
  (c) an emitting layer between the first conductive layer and the second conductive layer, wherein the emitting layer comprises at least one population of nanostructures, wherein the nanostructures comprise a core surrounded by at least one shell, wherein the core comprises $ZnSe_{1-x}Te_x$, wherein $0<x<1$, wherein the at least one shell comprises ZnS or ZnSe, and wherein the full width at half maximum (FWHM) of the nanostructure is about 20 nm to about 30 nm.

In some embodiments, the emitting layer is a nanostructure film.

In some embodiments, the light emitting diode comprises a first conductive layer, a second conductive layer, and an emitting layer, wherein the emitting layer is arranged between the first conductive layer and the second conductive layer. In some embodiments, the emitting layer is a thin film.

In some embodiments, the light emitting diode comprises additional layers between the first conductive layer and the second conductive layer such as a hole injection layer, a hole transport layer, and an electron transport layer. In some embodiments, the hole injection layer, the hole transport layer, and the electron transport layer are thin films. In some embodiments, the layers are stacked on a substrate.

When voltage is applied to the first conductive layer and the second conductive layer, holes injected at the first conductive layer move to the emitting layer via the hole injection layer and/or the hole transport layer, and electrons injected from the second conductive layer move to the emitting layer via the electron transport layer. The holes and electrons recombine in the emitting layer to generate excitons.

Making a Nanostructure Layer

In some embodiments, the nanostructure layer can be embedded in a polymeric matrix. As used herein, the term "embedded" is used to indicate that the nanostructure population is enclosed or encased with the polymer that makes up the majority of the components of the matrix. In some embodiments, at least one nanostructure population is suitably uniformly distributed throughout the matrix. In some embodiments, the at least one nanostructure population is distributed according to an application-specific distribution. In some embodiments, the nanostructures are mixed in a polymer and applied to the surface of a substrate.

In some embodiments, a nanostructure composition is deposited to form a nanostructure layer. In some embodiments, a nanostructure composition can be deposited by any suitable method known in the art, including but not limited to painting, spray coating, solvent spraying, wet coating, adhesive coating, spin coating, tape-coating, roll coating, flow coating, inkjet vapor jetting, drop casting, blade coating, mist deposition, or a combination thereof. The nanostructure composition can be coated directly onto the desired layer of a substrate. Alternatively, the nanostructure composition can be formed into a solid layer as an independent element and subsequently applied to the substrate. In some embodiments, the nanostructure composition can be deposited on one or more barrier layers.

In some embodiments, the nanostructure layer is cured after deposition. Suitable curing methods include photo-curing, such as UV curing, and thermal curing. Traditional laminate film processing methods, tape-coating methods, and/or roll-to-roll fabrication methods can be employed in forming a nanostructure layer.

Spin Coating

In some embodiments, the nanostructure composition is deposited onto a substrate using spin coating. In spin coating a small amount of material is typically deposited onto the center of a substrate loaded onto a machine called the spinner which is secured by a vacuum. A high speed of rotation is applied on the substrate through the spinner which causes centripetal force to spread the material from the center to the edge of the substrate. While most of the material is spun off, a certain amount remains of the substrate, forming a thin film of material on the surface as the rotation continues. The final thickness of the film is determined by the nature of the deposited material and the substrate in addition to the parameters chosen for the spin process such as spin speed, acceleration, and spin time. In some embodiments, a spin speed of 1500 to 6000 rpm is used with a spin time of 10-60 seconds.

Mist Deposition

In some embodiments, the nanostructure composition is deposited onto a substrate using mist deposition. Mist deposition takes place at room temperature and atmospheric pressure and allows precise control over film thickness by changing the process conditions. During mist deposition, a liquid source material is turned into a very fine mist and carried to the deposition chamber by nitrogen gas. The mist is then drawn to a wafer surface by a high voltage potential between the field screen and the wafer holder. Once the droplets coalesce on the wafer surface, the wafer is removed from the chamber and thermally cured to allow the solvent to evaporate. The liquid precursor is a mixture of solvent and material to be deposited. It is carried to the atomizer by pressurized nitrogen gas. Price, S.C., et al., "Formation of Ultra-Thin Quantum Dot Films by Mist Deposition," *ESC Transactions* 11:89-94 (2007).

Spray Coating

In some embodiments, the nanostructure composition is deposited onto a substrate using spray coating. The typical equipment for spray coating comprises a spray nozzle, an atomizer, a precursor solution, and a carrier gas. In the spray deposition process, a precursor solution is pulverized into micro sized drops by means of a carrier gas or by atomization (e.g., ultrasonic, air blast, or electrostatic). The droplets that come out of the atomizer are accelerated by the substrate surface through the nozzle by help of the carrier gas which is controlled and regulated as desired. Relative motion between the spray nozzle and the substrate is defined by design for the purpose of full coverage on the substrate.

In some embodiments, application of the nanostructure composition further comprises a solvent. In some embodiments, the solvent for application of the nanostructure composition is water, organic solvents, inorganic solvents, halogenated organic solvents, or mixtures thereof. Illustrative solvents include, but are not limited to, water, $D_2O$, acetone, ethanol, dioxane, ethyl acetate, methyl ethyl ketone, isopropanol, anisole, γ-butyrolactone, dimethylformamide, N-methylpyrrolidinone, dimethylacetamide, hexamethylphosphoramide, toluene, dimethylsulfoxide, cyclopentanone, tetramethylene sulfoxide, xylene, ε-caprolactone, tetrahydrofuran, tetrachloroethylene, chloroform, chlorobenzene, dichloromethane, 1,2-dichloroethane, 1,1,2,2-tetrachloroethane, or mixtures thereof.

In some embodiments, the nanostructure compositions are thermally cured to form the nanostructure layer. In some embodiments, the compositions are cured using UV light. In some embodiments, the nanostructure composition is coated directly onto a barrier layer of a nanostructure film, and an additional barrier layer is subsequently deposited upon the nanostructure layer to create the nanostructure film. A support substrate can be employed beneath the barrier film for added strength, stability, and coating uniformity, and to prevent material inconsistency, air bubble formation, and wrinkling or folding of the barrier layer material or other materials. Additionally, one or more barrier layers are preferably deposited over a nanostructure layer to seal the material between the top and bottom barrier layers. Suitably, the barrier layers can be deposited as a laminate film and optionally sealed or further processed, followed by incorporation of the nanostructure film into the particular lighting device. The nanostructure composition deposition process can include additional or varied components, as will be understood by persons of ordinary skill in the art. Such embodiments will allow for in-line process adjustments of the nanostructure emission characteristics, such as brightness and color (e.g., to adjust the quantum dot film white point), as well as the nanostructure film thickness and other characteristics. Additionally, these embodiments will allow for periodic testing of the nanostructure film characteristics during production, as well as any necessary toggling to achieve precise nanostructure film characteristics. Such testing and adjustments can also be accomplished without changing the mechanical configuration of the processing line, as a computer program can be employed to electronically change the respective amounts of mixtures to be used in forming a nanostructure film.

Barrier Layers

In some embodiments, the molded article comprises one or more barrier layers disposed on either one or both sides of the nanostructure layer. Suitable barrier layers protect the nanostructure layer and the molded article from environmental conditions such as high temperatures, oxygen, and moisture. Suitable barrier materials include non-yellowing, transparent optical materials which are hydrophobic, chemically and mechanically compatible with the molded article, exhibit photo- and chemical-stability, and can withstand high temperatures. In some embodiments, the one or more barrier layers are index-matched to the molded article. In some embodiments, the matrix material of the molded article and the one or more adjacent barrier layers are index-matched to have similar refractive indices, such that most of the light transmitting through the barrier layer toward the molded article is transmitted from the barrier layer into the nanostructure layer. This index-matching reduces optical losses at the interface between the barrier and matrix materials.

The barrier layers are suitably solid materials, and can be a cured liquid, gel, or polymer. The barrier layers can comprise flexible or non-flexible materials, depending on the particular application. Barrier layers are preferably planar layers, and can include any suitable shape and surface area configuration, depending on the particular lighting application. In some embodiments, the one or more barrier layers will be compatible with laminate film processing techniques, whereby the nanostructure layer is disposed on at least a first barrier layer, and at least a second barrier layer is disposed on the nanostructure layer on a side opposite the nanostructure layer to form the molded article according to one embodiment. Suitable barrier materials include any suitable barrier materials known in the art. In some embodiments, suitable barrier materials include glasses, polymers, and oxides. Suitable barrier layer materials include, but are not limited to, polymers such as polyethylene terephthalate (PET); oxides such as silicon oxide, titanium oxide, or aluminum oxide (e.g., $SiO_2$, $Si_2O_3$, $TiO_2$, or $Al_2O_3$); and suitable combinations thereof. Preferably, each barrier layer of the molded article comprises at least 2 layers comprising different materials or compositions, such that the multi-layered barrier eliminates or reduces pinhole defect alignment in the barrier layer, providing an effective barrier to oxygen and moisture penetration into the nanostructure layer. The nanostructure layer can include any suitable material or combination of materials and any suitable number of barrier layers on either or both sides of the nanostructure layer. The materials, thickness, and number of barrier layers will depend on the particular application, and will suitably be chosen to maximize barrier protection and brightness of the nanostructure layer while minimizing thickness of the molded article. In preferred embodiments, each barrier layer comprises a laminate film, preferably a dual laminate film, wherein the thickness of each barrier layer is sufficiently thick to eliminate wrinkling in roll-to-roll or laminate manufacturing processes. The number or thickness of the barriers may further depend on legal toxicity guidelines in embodiments where the nanostructures comprise heavy metals or other toxic materials, which guidelines may require more or thicker barrier layers. Additional considerations for the barriers include cost, availability, and mechanical strength.

In some embodiments, the nanostructure film comprises two or more barrier layers adjacent each side of the nanostructure layer, for example, two or three layers on each side or two barrier layers on each side of the nanostructure layer. In some embodiments, each barrier layer comprises a thin glass sheet, e.g., glass sheets having a thickness of about 100 µm, 100 µm or less, or 50 µm or less.

Each barrier layer of the molded article can have any suitable thickness, which will depend on the particular requirements and characteristics of the lighting device and application, as well as the individual film components such as the barrier layers and the nanostructure layer, as will be understood by persons of ordinary skill in the art. In some embodiments, each barrier layer can have a thickness of 50 µm or less, 40 µm or less, 30 µm or less, 25 µm or less, 20 µm or less, or 15 µm or less. In certain embodiments, the barrier layer comprises an oxide coating, which can comprise materials such as silicon oxide, titanium oxide, and aluminum oxide (e.g., $SiO_2$, $Si_2O_3$, $TiO_2$, or $Al_2O_3$). The oxide coating can have a thickness of about 10 µm or less, 5 µm or less, 1 µm or less, or 100 nm or less. In certain embodiments, the barrier comprises a thin oxide coating with a thickness of about 100 nm or less, 10 nm or less, 5 nm or less, or 3 nm or less. The top and/or bottom barrier can consist of the thin oxide coating, or may comprise the thin oxide coating and one or more additional material layers.

Molded Articles with Improved Properties

In some embodiments, a molded article prepared using the nanostructures shows an EQE of between about 1.5% and about 20%, about 1.5% and about 15%, about 1.5% and about 12%, about 1.5% and about 10%, about 1.5% and about 8%, about 1.5% and about 4%, about 1.5% and about 3%, about 3% and about 20%, about 3% and about 15%, about 3% and about 12%, about 3% and about 10%, about 3% and about 8%, about 8% and about 20%, about 8% and about 15%, about 8% and about 12%, about 8% and about 10%, about 10% and about 20%, about 10% and about 15%, about 10% and about 12%, about 12% and about 20%, about 12% and about 15%, or about 15% and about 20%. In some embodiments, the nanostructure is a quantum dot. In some embodiments, the molded article is a light emitting diode.

In some embodiments, a molded article prepared using the nanostructures shows a photoluminescence spectrum with an emission maximum of between 450 nm and 550 nm. In some embodiments, a molded article prepared using the nanostructures shows a photoluminescence spectrum with an emission maximum of between 450 nm and 460 nm. In some embodiments, the photoluminescence spectrum for the core/shell(s) nanostructures has an emission maximum of between about 450 nm and about 460 nm.

The following examples are illustrative and non-limiting, of the products and methods described herein. Suitable modifications and adaptations of the variety of conditions, formulations, and other parameters normally encountered in the field and which are obvious to those skilled in the art in view of this disclosure are within the spirit and scope of the invention.

EXAMPLES

Example 1

Synthesis of $ZnSe_{1-x}Te_x$ Alloy Nanostructures Using Co-injection Method

The TOPTe precursor mixture was prepared by first diluting TOPTe (1.0 M Te, 460 µL) with 5.0 mL dried and distilled oleylamine. Lithium triethylborohydride (1.0 M in THF, 460 µL) was added to this solution which resulted in a deeply purple solution. Finally, zinc oleate (0.5 M in TOP, 920 µL) was added which resulted in a colorless opaque viscous gel which can be drawn into a syringe.

Oleylamine (30.0 mL) was added to a 250 mL three-neck flask and degassed under vacuum at 110° C. for 30 minutes. The mixture was heated to 300° C. under nitrogen flow. Once this temperature was reached, a solution of trioctylphosphine selenide (TOPSe, 5.4 mmol) and diphenylphosphine (535 µL) in TOP (5.8 mL total) was added to the flask. Once the temperature rebounded to 300° C., the TOPTe precursor formulation described above and a solution of diethylzinc (590 µL) in TOP (2.0 mL) were quickly and simultaneously injected from separate syringes. The temperature was set to 280° C. and after 5 minutes an infusion of a solution of diethylzinc (588 µL) and TOPSe (8.45 mmol) in TOP (7.6 mL total) was started at a rate of 1.0 mL/minute with a 10 minute break after addition of 7.6 mL. After the precursor infusion was finished the reaction mixture was held at 280° C. for 5 minutes and then cooled to room temperature. The growth solution was diluted with an equal volume of toluene, and the nanocrystals were precipitated by addition of ethanol. After centrifugation the supernatant was discarded, and the nanocrystals were re-dispersed in toluene. The concentration was measured as the dry weight by evaporating the solvent off an aliquot. The dried material was further subjected to thermogravimetric analysis to determine the inorganic content.

Example 2

Synthesis of $ZnSe_{1-x}Te_x$ Alloy Nanostructures Using Offset Injection Method The TOPTe precursor mixture was prepared by first diluting TOPTe (1.0 M Te, 460 µL) with 5.0 mL dried and distilled oleylamine. Lithium triethylborohydride (1.0 M in THF, 460 µL) was added to this solution which resulted in a deeply purple solution. Finally, zinc oleate (0.5 M in TOP, 920 µL) was added which resulted in a colorless opaque viscous gel which can be drawn into a syringe.

Oleylamine (30 mL) was added to a 100 mL three-neck flask and degassed under vacuum at 110° C. for 30 minutes. The mixture was heated to 300° C. under nitrogen flow. Once this temperature was reached, a solution of trioctylphosphine selenide (TOPSe, 5.4 mmol) and diphenylphosphine (535 µL) in TOP (5.8 mL total) was added to the flask. Once the temperature rebounded to 300° C., the TOPTe precursor formulation described above was quickly injected. After 3 seconds, a solution of diethylzinc (590 µL) in TOP (2.0 mL) was injected. The temperature was set to 280° C. and after 5 minutes an infusion of a solution of diethylzinc (588 µL) and TOPSe (8.45 mmol) in TOP (7.6 mL total) was started at a rate of 1.0 mL/minute with a 10 minute break after addition of 7.6 mL. After the precursor infusion was finished the reaction mixture was held at 280° C. for 5 minutes and then cooled to room temperature. The growth solution was diluted with an equal volume of toluene, and the nanocrystals were precipitated by addition of ethanol. After centrifugation the supernatant was discarded, and the nanocrystals were re-dispersed in toluene. The concentration was measured as the dry weight by evaporating the solvent off an aliquot. The dried material was further subjected to thermogravimetric analysis to determine the inorganic content.

Example 3

Synthesis of $ZnSe_{1-x}Te_x$/ZnSe/ZnS Core/Shell Nanostructures

Coating a ZnSe shell or a ZnSe/ZnS multi-shell on $ZnSe_{1-x}Te_x$ alloy nanocrystals was performed using the procedure described in U.S. Patent Application Publication No. 2017/066965.

Example 4

Properties of $ZnSe_{1-x}Te_x$ Core/Shell(s) Nanostructures

Figure 2:
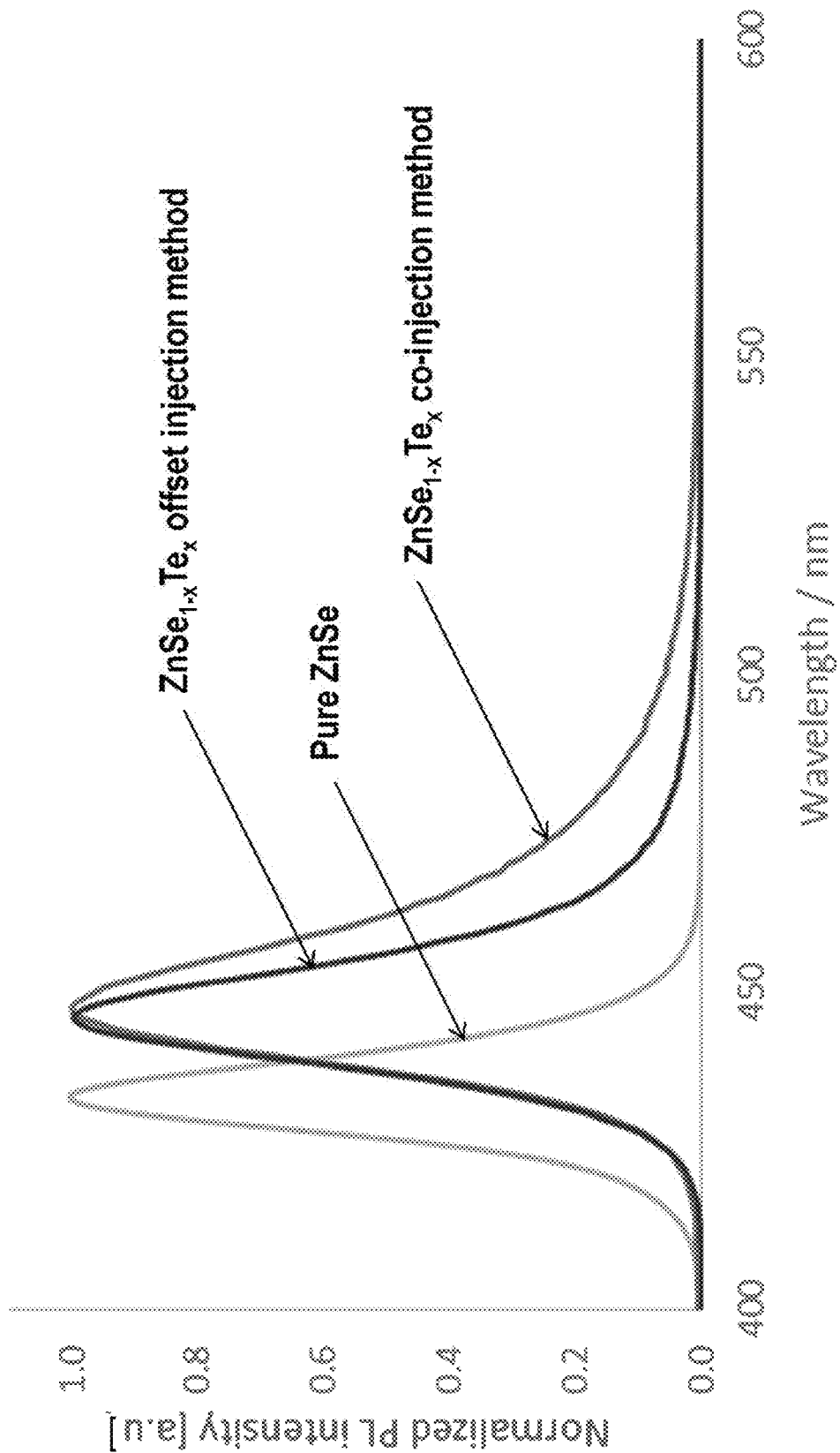
FIG. 2 shows photoluminescence spectra in solution for a ZnSe core, for a $ZnSe_{1-x}Te_x$ core prepared using the co-injection method, and for a $ZnSe_{1-x}Te_x$ core prepared using the offset injection method.

The solution photoluminescence spectra of the $ZnSe_{1-x}Te_x$/ZnSe/ZnS core/shell/shell nanostructures prepared using the co-injection method and the offset inject method are shown in FIG. 2. As shown in FIG. 2, a red shift is achieved with the co-injection and the offset injection method. The offset injection method resulted in a narrower peak, because the formation of ZnTe was facilitated. The optical properties of the $ZnSe_{1-x}Te_x$/ZnSe core/shell or $ZnSe_{1-x}Te_x$/ZnSe/ZnS core/shell/shell nanostructures can be tuned by varying the number of shell monolayers as shown in TABLE 1.

TABLE 1

| Example | Te (mol %) | ZnSe Monolayers | ZnS Monolayers | PWL (nm) | $MF_x$ | FWHM (nm) | QY |
|---|---|---|---|---|---|---|---|
| 1 | 8 | 4 | 0 | 449 | None | 21 | 66% |
| 2 | 8 | 6 | 0 | 450 | None | 18 | 60% |
| 3 | 8 | 6 | 0 | 451 | $ZrF_4$ | 19 | 71% |
| 4 | 8 | 6 | 0 | 451 | $ZnF_2$ | 16 | 64% |
| 5 | 8 | 4 | 4 | 445 | None | 19 | 48% |
| 6 | 8 | 6 | 6 | 446 | None | 19 | 47% |
| 7 | 8 | 6 | 6 | 447 | $ZrF_4$ | 21 | 53% |
| 8 | 8 | 6 | 6 | 447 | $HfF_4$ | 21 | 52% |
| 9 | 8 | 6 | 6 | 443 | $ZnF_2$ | 20 | 40% |
| 10 | 8 | 6 | 6 | 445 | $ZrF_4$ | 19 | 54% |

Example 5

$ZnSe_{1-x}Te_x$ alloy nanocrystals and $ZnSe_{1-x}Te_x$/ZnSe/ZnS quantum dots with low FWHM and high QY A: Synthesis of $ZnSe_{1-x}Te_x$ Alloy Nanocrystals Using Reduced TOP-Te The Te precursor mixture was prepared by first diluting TOPTe (1 M Te, 690 µL) with 4.0 mL dried and distilled oleylamine. Lithium triethylborohydride (1 M in THF, 690 µL) was added to this solution which resulted in a deeply purple solution. Finally, zinc oleate (0.5 M in TOP, 1180 µL) was added which resulted in a colorless opaque viscous gel which could be drawn into a syringe. (In entry 7 of Table 2 below, 1036 µl TOPTe, 1036 µl $LiEt_3BH$ and 2.08 ml $ZnOA_2$/TOP were used instead.)

Oleylamine (30 mL) and anhydrous zinc fluoride (118 mg, 1.04 mmol) were added to a 250 mL three neck flask and degassed under vacuum at 110° C. for 30 min. (Entry 7 contained no $ZnF_2$; all others did.) Then the mixture was heated to 300° C. under nitrogen flow. Once this temperature was reached, a solution of trioctylphosphine selenide (TOPSe, 5.4 mmol) and diphenylphosphine (535 µL) in TOP (5.8 mL total) were added to the flask. Once the temperature rebounded to 280° C., the Te precursor formulation described above was quickly injected. After 3 seconds, a solution of diethyl zinc (590 µL) in TOP (2.0 mL) was quickly injected. The temperature was set to 280° C. and after 5 min the infusion of a solution of diethylzinc (588 µL) and TOPSe (8.4 mmol) in TOP (7.6 mL total) was started at a rate of 1.0 mL/min until complete addition of the full 7.6 mL. After the precursor infusion was finished, the reaction mixture was held at 280° C. for 5 min and then cooled to room temperature. The growth solution was diluted with an equal volume of toluene (60 mL), and the nanocrystals were precipitated by addition of ethanol (120 mL). After centrifugation the supernatant was discarded, and the nanocrystals were redispersed in hexane (5 mL). The concentration was measured as the dry weight by evaporating the solvent off an aliquot. The dried material was further subjected to thermogravimetric analysis to determine the inorganic content.

B: Synthesis of $ZnSe_{1-x}Te_x$/ZnSe Buffered Nanocrystals

This example describes a coating of a single monolayer ZnSe buffer layer on $ZnSe_{1-x}Te_x$ alloy nanocrystals of 2.3 nm average diameter with a target shell thickness of 1 ML ZnSe. (Entries 1 and 3-7 of Table 2 include this sequence of reactions.)

A 100 mL three neck flask was charged with zinc oleate (6.23 g), lauric acid (3.96 g), trioctylphosphine oxide (4.66 g), zirconium fluoride (644 mg) and TOP (9.4 mL). (The reactions for entries 1 and 6 of Table 2 did not contain lauric acid.) The flask was then subjected to three vacuum and nitrogen backfill cycles before heating to 100° C. and then degassed for 30 min. The reaction mixture was placed under a blanket of nitrogen and a solution of $ZnSe_{1-x}Te_x$ cores (4.0 mL, 28.0 mg/mL in hexane) was mixed with TOP-Se (1.8 ml of 0.3M selenium in TOP) and added to the flask. The flask was then evacuated for 2 min and then heated to 310° C. under nitrogen flow. Once this temperature was reached, the solution was immediately cooled to room temperature. The reaction mixture was diluted with toluene (45 mL). The largest core/shell nanocrystals were precipitated by addition of ethanol (64 mL) and then isolated by centrifugation, decantation of the supernatant, and disposal of the pelletized nanocrystals. The supernatant from the previous step was then fully precipitated by the addition of ethanol (75 ml) and then isolated by centrifugation, decantation of the supernatant, and redispersion in hexane (5 ml). This solution was filtered through a PTFE 0.45 µm syringe filter. The concentration was measured as the dry weight by evaporating the solvent off an aliquot. The dried material was further subjected to thermogravimetric analysis to determine the inorganic content.

C: Synthesis of $ZnSe_{1-x}Te_x$/ZnSe Buffered Nanocrystals

This example describes a coating of a ZnSe buffer layer on $ZnSe_{1-x}Te_x$ alloy nanocrystals of 4.0 nm average diameter with a target shell thickness of 4 ML ZnSe.

A 100 mL three neck flask was charged with zinc oleate (6.23 g), trioctylphosphine oxide (4.66 g), zirconium fluoride (644 mg), and TOP (9.4 mL). (In some cases, zinc fluoride (333.8 mg) was also added; the reaction leading to Table 2 entry #2 also contained lauric acid (3.39 g), while the remaining reactions did not; the reactions leading to Table 2 entry 4 contained tri-n-octylamine (TOA) in place of trioctylphosphine oxide; and the reactions leading to Table 2 entries 3-5 contained both zirconium fluoride and zinc fluoride.) The flask was then subjected to three vacuum and nitrogen backfill cycles before heating to 100° C. and degassing for 30 min. The reaction mixture was placed under a blanket of nitrogen and a solution of $ZnSe_{1-x}Te_x$ cores (4.0 mL, 28.0 mg/mL in hexane) mixed with TOP-Se (1.8 ml of 0.3M selenium in TOP) was added to the flask. The flask was evacuated for 2 min and then heated to 310° C. under nitrogen flow. Once this temperature was reached, the slow infusion of TOP-Se (10.4 mL, 0.3 M in TOP) with a rate of 0.325 mL/min was started. After the selenium infusion was finished, the reaction was held at 310° C. for 5 min and then cooled to room temperature. (The reaction mixtures leading to Table 2 entries 3-5 were held at 340° C.) The reaction mixture was diluted with toluene (45 mL). The core/shell nanocrystals were precipitated by addition of ethanol (135 mL) and then isolated by centrifugation, decantation of the supernatant, and redispersion of the nanocrystals in hexane (5 mL). This solution was filtered through a PTFE 0.22 µm syringe filter and the concentration is measured as the dry weight by evaporating the solvent off an aliquot. The dried material was further subjected to thermogravimetric analysis to determine the inorganic content.

D: Synthesis of $ZnSe_{1-x}Te_x$/ZnSe/ZnS Core/Shell Nanocrystals

This example describes the coating of a ZnS shell on $ZnSe_{1-x}Te_x$/ZnSe alloy nanocrystals of 6.1 nm average diameter with a target shell thickness of 2-4 ML ZnS. (Table 2 entries 1-3, and 5.)

A 25 mL three neck flask was charged with zinc oleate (375 mg), trioctylphosphine oxide (281 mg), lauric acid (259 mg), zinc fluoride (648 mg), and TOP (0.566 mL). (Only the reaction mixture leading to Table 2 entry #2 contained lauric acid in this step; the reaction mixtures leading to Table 2 entries 3 and 5 contained 389 mg zinc fluoride.) In the reaction mixtures leading to Table 2 entries 3 and 5, zirconium fluoride (75 mg) was also added. The flask was then subjected to three vacuum and nitrogen backfill cycles before heating to 100° C. and degassing for 30 min. The reaction mixture was placed under a blanket of nitrogen and a solution of $ZnSe_{1-x}Te_x$ cores (obtained from C, above, 0.30 mL, 216.0 mg/mL in hexane) mixed with zinc oleate/TOP-S (0.064 ml of 2.0M sulfur in TOP+0.254 ml 0.5M zinc oleate in TOP) was added to the flask. The flask was evacuated for 2 min and then heated to 310° C. under nitrogen flow. Once this temperature was reached, the slow infusion of zinc oleate/TOP-S(2 mL, 0.3 M in TOP) with a rate of 0.103 mL/min was started. After the sulfur infusion was finished, the reaction was held at 310° C. for 5 min and then cooled to room temperature. (The reaction mixtures leading to Table 2 entries 3 & 5 were held at 340° C.) The reaction mixture was diluted with toluene (5 mL). The core/shell nanocrystals were precipitated by addition of ethanol (10 mL) and then isolated by centrifugation, decantation of the supernatant, and redispersion of the nanocrystals in hexane (5 mL). The precipitation was repeated once with ethanol (10 mL), and the nanocrystals were finally redispersed in octane (3 mL). This solution was filtered through a PTFE 0.22 µm syringe filter and the concentration was adjusted to 18 mg/mL after measuring the dry weight of an aliquot.

The optical properties of the nanostructures made according to this example are shown in Table 2. Unexpectedly, these nanostructures exhibited much higher QY compared to the nanostructures made according to Example 4.

TABLE 2

| # | PWL/ nm | FWHM/ nm | QY/ % |
|---|---|---|---|
| 1 | 445 | 25 | 81 |
| 2 | 448 | 28 | 88 |
| 3 | 451 | 28 | 87 |
| 4 | 452 | 30 | 89 |
| 5 | 454 | 25 | 83 |
| 6 | 456 | 30 | 78 |
| 7 | 461 | 30 | 74 |

While various embodiments have been described above, it should be understood that they have been presented by way of example only, and not limitation. It will be apparent to persons skilled in the relevant art that various changes in form and detail can be made therein without departing from the spirit and scope of the invention. Thus, the breadth and scope should not be limited by any of the above-described exemplary embodiments, but should be defined only in accordance with the following claims and their equivalents.

All publications, patents and patent applications mentioned in this specification are indicative of the level of skill of those skilled in the art to which this invention pertains, and are herein incorporated by reference to the same extent as if each individual publication, patent or patent application was specifically and individually indicated to be incorporated by reference.

What is claimed is:

1. A population of nanostructures, each nanostructure of the population of nanostructures respectively comprising:
   a core comprising $ZnSe_{1-x}Te_x$, where $0<x<1$; and
   at least one shell surrounding the core and selected from the group consisting of ZnS, ZnSe, ZnTe, and an alloy thereof,
   wherein the population of nanostructures comprises a photoluminescence quantum yield of between about 80% and 99%.

2. The population of nanostructures of claim 1, having a photoluminescence emission peak with a full width at half maximum (FWHM) between about 20 nm and about 30 nm.

3. The population of nanostructures of claim 1, wherein an emission wavelength of the population is between about 440 nm and about 460 nm.

4. The population of nanostructures of claim 1, wherein each core is surrounded by two shells.

5. The population of nanostructures of claim 1, wherein each at least one shell comprises ZnSe or ZnS.

6. The population of nanostructures of claim 1, wherein each at least one shell comprises between about 4 and about 6 monolayers of ZnSe.

7. The population of nanostructures of claim 1, wherein each at least one shell comprises between about 4 and about 6 monolayers of ZnS.

8. The population of nanostructures of claim 1, wherein each nanostructure comprises two shells, wherein a first shell comprises ZnSe and a second shell comprises ZnS.

9. The population of nanostructures of claim 1, wherein each nanostructure is a quantum dot.

10. The population of nanostructures of claim 1, wherein each nanostructure is free of cadmium.

11. The population of nanostructures of claim 1, wherein the photoluminescence quantum yield of the population of nanostructures is between about 85% and about 95%.

12. A device comprising the population of nanostructures of claim 1.

13. The population of nanostructures of claim 1, wherein each at least one shell has a thickness greater than or equal to 0.05 nm and less than or equal to 3.5 nm.

14. A light emitting diode comprising:
   (a) a first conductive layer;
   (b) a second conductive layer; and
   (c) an emitting layer between the first conductive layer and the second conductive layer, the emitting layer comprising a population of nanostructures,
   each nanostructure of the population of nanostructures respectively comprising:
      a core comprising $ZnSe_{1-x}Te_x$, where $0<x<1$; and
      at least one shell surrounding the core and selected from the group consisting of ZnS, ZnSe, ZnTe, and an alloy thereof,
      wherein an external quantum efficiency of the light emitting diode is between about 8% and about 20%, and wherein a photoluminescence quantum yield of the population of nanostructures is between about 80% and about 99%.

15. The light emitting diode of claim 14, wherein the population of nanostructures has a photoluminescence emission peak with a full width at half maximum (FWHM) between about 20 nm and about 30 nm.

16. A light emitting diode comprising:
   (a) a first conductive layer;
   (b) a second conductive layer; and
   (c) an emitting layer between the first conductive layer and the second conductive layer, the emitting layer comprising a population of nanostructures having a photoluminescence quantum yield between about 80% and about 99%, each nanostructure of the population of nanostructures respectively comprising:
      a core comprising $ZnSe_{1-x}Te_x$, where $0<x<1$; and
      at least one shell surrounding the core and selected from the group consisting of ZnS, ZnSe, ZnTe, and an alloy thereof.

17. The light emitting diode of claim 16, wherein the population of nanostructures has a photoluminescence emission peak with a full width at half maximum (FWHM) between about 20 nm and about 30 nm.

* * * * *